(12) United States Patent
Huemoeller et al.

(10) Patent No.: US 7,589,398 B1
(45) Date of Patent: Sep. 15, 2009

(54) EMBEDDED METAL FEATURES STRUCTURE

(75) Inventors: Ronald Patrick Huemoeller, Chandler, AZ (US); Sukianto Rusli, Phoexix, AZ (US); David Jon Hiner, Chandler, AZ (US); Nozad Osman Karim, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 194 days.

(21) Appl. No.: 11/543,540

(22) Filed: Oct. 4, 2006

(51) Int. Cl.
*H01L 23/58* (2006.01)
*H05K 3/02* (2006.01)
*H01R 12/04* (2006.01)

(52) U.S. Cl. .............. 257/635; 257/750; 257/752; 257/758; 257/E23.062; 257/E23.063; 29/832; 29/842; 29/846; 174/255; 174/256; 174/261; 174/262

(58) Field of Classification Search ............ 257/635, 257/750, 752, 758, E23.062, E23.063, E23.064, 257/E23.069; 29/832, 842, 846; 174/255, 174/256, 261, 262
See application file for complete search history.

(56) References Cited

U.S. PATENT DOCUMENTS

| | | | |
|---|---|---|---|
| 3,324,014 A | 6/1967 | Modjeska | 205/122 |
| 3,778,900 A | 12/1973 | Haining et al. | 29/628 |
| 3,868,724 A | 2/1975 | Perrino | 357/65 |
| 3,916,434 A | 10/1975 | Garboushian | 357/74 |
| 4,322,778 A | 3/1982 | Barbour et al. | 361/414 |
| 4,508,754 A | 4/1985 | Stepan | 427/53.1 |
| 4,532,152 A | 7/1985 | Elarde | 427/96 |
| 4,532,419 A | 7/1985 | Takeda | 235/492 |
| 4,604,799 A | 8/1986 | Gurol | 29/847 |
| 4,642,160 A | 2/1987 | Burgess | 156/630 |
| 4,685,033 A | 8/1987 | Inoue | 361/414 |
| 4,706,167 A | 11/1987 | Sullivan | 361/406 |

(Continued)

FOREIGN PATENT DOCUMENTS

JP     05-109975     4/1993

(Continued)

OTHER PUBLICATIONS

Huemoeller et al., U.S. Appl. No. 10/947,124, filed Sep. 22, 2004, entitled "Method for Making an Integrated Circuit Substrate Having Embedded Back-Side Access Conductors and Vias".

(Continued)

*Primary Examiner*—Long K Tran
(74) *Attorney, Agent, or Firm*—Gunnison, McKay & Hodgson, L.L.P.; Serge J. Hodgson

(57) ABSTRACT

A method and structure for creating embedded metal features includes embedded trace substrates wherein bias and signal traces are embedded in a first surface of the embedded trace substrate and extend into the body of the embedded trace substrate. The bias trace and signal trace trenches are formed into the substrate body using LASER ablation, or other ablation, techniques. Using ablation techniques to form the bias and signal trace trenches allows for extremely accurate control of the depth, width, shape, and horizontal displacement of the bias and signal trace trenches. As a result, the distance between the bias traces and the signal traces eventually formed in the trenches, and therefore the electrical properties, such as impedance and noise shielding, provided by the bias traces, can be very accurately controlled.

19 Claims, 24 Drawing Sheets

U.S. PATENT DOCUMENTS

| | | | |
|---|---|---|---|
| 4,716,049 A | 12/1987 | Patraw | 427/96 |
| 4,786,952 A | 11/1988 | MacIver et al. | 357/23.4 |
| 4,806,188 A | 2/1989 | Rellick | 156/89 |
| 4,811,082 A | 3/1989 | Jacobs et al. | 357/80 |
| 4,897,338 A | 1/1990 | Spicciati et al. | 430/314 |
| 4,905,124 A | 2/1990 | Banjo et al. | 361/395 |
| 4,915,983 A | 4/1990 | Lake et al. | 430/314 |
| 4,964,212 A | 10/1990 | Deroux-Dauphin et al. | 29/852 |
| 4,974,120 A | 11/1990 | Kodai et al. | 361/392 |
| 4,996,391 A | 2/1991 | Schmidt | 174/255 |
| 5,021,047 A | 6/1991 | Movern | 604/110 |
| 5,053,357 A | 10/1991 | Lin et al. | 437/204 |
| 5,072,075 A | 12/1991 | Lee et al. | 174/264 |
| 5,081,520 A | 1/1992 | Yoshii et al. | 357/80 |
| 5,108,553 A | 4/1992 | Foster et al. | 205/125 |
| 5,110,664 A | 5/1992 | Nakanishi et al. | 428/195 |
| 5,191,174 A | 3/1993 | Chang et al. | 174/266 |
| 5,229,550 A | 7/1993 | Bindra et al. | 174/262 |
| 5,239,448 A | 8/1993 | Perkins et al. | 361/764 |
| 5,247,429 A | 9/1993 | Iwase et al. | 362/29 |
| 5,263,243 A | 11/1993 | Taneda et al. | 29/830 |
| 5,283,459 A | 2/1994 | Hirano et al. | 257/419 |
| 5,371,654 A | 12/1994 | Beaman et al. | 361/744 |
| 5,379,191 A | 1/1995 | Carey et al. | 361/777 |
| 5,404,044 A | 4/1995 | Booth et al. | 257/698 |
| 5,440,805 A | 8/1995 | Daigle et al. | 29/830 |
| 5,463,253 A | 10/1995 | Waki et al. | 257/724 |
| 5,474,957 A | 12/1995 | Urushima | 437/209 |
| 5,474,958 A | 12/1995 | Djennas et al. | 437/211 |
| 5,508,938 A | 4/1996 | Wheeler | 364/488 |
| 5,530,288 A | 6/1996 | Stone | 257/700 |
| 5,531,020 A | 7/1996 | Durand et al. | 29/840 |
| 5,574,309 A | 11/1996 | Papapietro et al. | 257/679 |
| 5,581,498 A | 12/1996 | Ludwig et al. | 365/63 |
| 5,582,858 A | 12/1996 | Adamopoulos et al. | 427/96 |
| 5,616,422 A | 4/1997 | Ballard et al. | 428/621 |
| 5,637,832 A | 6/1997 | Danner | 174/260 |
| 5,674,785 A | 10/1997 | Akram et al. | 437/217 |
| 5,719,749 A | 2/1998 | Stopperan | 361/769 |
| 5,739,579 A | 4/1998 | Chiang et al. | 257/635 |
| 5,739,581 A | 4/1998 | Chillara | 257/668 |
| 5,739,585 A | 4/1998 | Akram et al. | 257/698 |
| 5,739,588 A | 4/1998 | Ishida et al. | 257/782 |
| 5,742,479 A | 4/1998 | Asakura | 361/737 |
| 5,774,340 A | 6/1998 | Chang et al. | 361/771 |
| 5,784,259 A | 7/1998 | Asakura | 361/752 |
| 5,798,014 A | 8/1998 | Weber | 156/263 |
| 5,822,190 A | 10/1998 | Iwasaki | 361/737 |
| 5,826,330 A | 10/1998 | Isoda et al. | 29/852 |
| 5,835,355 A | 11/1998 | Dordi | 361/760 |
| 5,847,453 A | 12/1998 | Uematsu et al. | 257/728 |
| 5,894,108 A | 4/1999 | Mostafazadeh et al. | 174/52.4 |
| 5,903,052 A | 5/1999 | Chen et al. | 257/706 |
| 5,936,843 A | 8/1999 | Ohshima et al. | 361/760 |
| 5,952,611 A | 9/1999 | Eng et al. | 174/52.4 |
| 5,990,546 A | 11/1999 | Igarashi et al. | 257/700 |
| 6,004,619 A | 12/1999 | Dippon et al. | 427/97 |
| 6,013,948 A | 1/2000 | Akram et al. | 257/698 |
| 6,021,564 A | 2/2000 | Hanson | 29/852 |
| 6,028,364 A | 2/2000 | Ogino et al. | 257/778 |
| 6,034,427 A | 3/2000 | Lan et al. | 257/698 |
| 6,040,622 A | 3/2000 | Wallace | 257/679 |
| 6,060,778 A | 5/2000 | Jeong et al. | 257/710 |
| 6,069,407 A | 5/2000 | Hamzehdoost | 257/774 |
| 6,072,243 A | 6/2000 | Nakanishi | 257/783 |
| 6,081,036 A | 6/2000 | Hirano et al. | 257/773 |
| 6,115,910 A | 9/2000 | Ghahghahi | 29/833 |
| 6,119,338 A | 9/2000 | Wang et al. | 29/852 |
| 6,122,171 A | 9/2000 | Akram et al. | 361/704 |
| 6,127,250 A | 10/2000 | Sylvester et al. | 438/584 |
| 6,127,833 A | 10/2000 | Wu et al. | 324/755 |
| 6,160,705 A | 12/2000 | Stearns et al. | 361/704 |
| 6,162,365 A | 12/2000 | Bhatt et al. | 216/13 |
| 6,172,419 B1 | 1/2001 | Kinsman | 257/737 |
| 6,175,087 B1 | 1/2001 | Keesler et al. | 174/261 |
| 6,184,463 B1 | 2/2001 | Panchou et al. | 174/52.4 |
| 6,194,250 B1 | 2/2001 | Melton et al. | |
| 6,204,453 B1 | 3/2001 | Fallon et al. | 174/255 |
| 6,214,641 B1 | 4/2001 | Akram | 438/107 |
| 6,235,554 B1 | 5/2001 | Akram et al. | 438/109 |
| 6,239,485 B1 | 5/2001 | Peters et al. | 257/700 |
| D445,096 S | 7/2001 | Wallace | D14/117 |
| D446,525 S | 8/2001 | Okamoto et al. | D14/436 |
| 6,274,821 B1 | 8/2001 | Echigo et al. | 174/255 |
| 6,280,641 B1 | 8/2001 | Gaku et al. | 216/17 |
| 6,316,285 B1 | 11/2001 | Jiang et al. | 438/106 |
| 6,351,031 B1 | 2/2002 | Iijima et al. | 257/698 |
| 6,352,914 B2 | 3/2002 | Ball et al. | 438/599 |
| 6,353,999 B1 | 3/2002 | Cheng | 29/852 |
| 6,365,975 B1 | 4/2002 | DiStefano et al. | 257/777 |
| 6,368,967 B1 | 4/2002 | Besser | 438/687 |
| 6,376,906 B1 | 4/2002 | Asai et al. | 257/698 |
| 6,378,201 B1 | 4/2002 | Tsukada et al. | 29/852 |
| 6,392,160 B1 | 5/2002 | Andry et al. | 174/261 |
| 6,395,578 B1 | 5/2002 | Shin et al. | 438/106 |
| 6,405,431 B1 | 6/2002 | Shin et al. | 29/852 |
| 6,406,942 B2 | 6/2002 | Honda | 438/119 |
| 6,407,341 B1 | 6/2002 | Anstrom et al. | 174/255 |
| 6,407,930 B1 | 6/2002 | Hsu | 361/784 |
| 6,418,615 B1 | 7/2002 | Rokugawa et al. | 29/852 |
| 6,426,550 B2 | 7/2002 | Ball et al. | 257/700 |
| 6,451,509 B2 | 9/2002 | Keesler et al. | 430/311 |
| 6,472,306 B1 | 10/2002 | Lee et al. | 438/623 |
| 6,479,762 B2 | 11/2002 | Kusaka | 174/261 |
| 6,497,943 B1 | 12/2002 | Jimarez et al. | 428/209 |
| 6,502,774 B1 | 1/2003 | Johansson et al. | 241/37 |
| 6,517,995 B1 | 2/2003 | Jacobson et al. | 430/320 |
| 6,534,391 B1 | 3/2003 | Huemoeller et al. | 438/612 |
| 6,534,723 B1 | 3/2003 | Asai et al. | 174/255 |
| 6,544,638 B2 | 4/2003 | Fischer et al. | 428/322.7 |
| 6,570,258 B2 | 5/2003 | Ma et al. | 257/774 |
| 6,574,106 B2 | 6/2003 | Mori | 361/705 |
| 6,586,682 B2 | 7/2003 | Strandberg | 174/255 |
| 6,608,757 B1 | 8/2003 | Bhatt et al. | 361/748 |
| 6,637,105 B1 | 10/2003 | Watanabe et al. | 29/852 |
| 6,660,559 B1 | 12/2003 | Huemoeller et al. | 438/106 |
| 6,715,204 B1 | 4/2004 | Tsukada et al. | 29/847 |
| 6,727,645 B2 | 4/2004 | Tsujimura et al. | 313/504 |
| 6,730,857 B2 | 5/2004 | Konrad et al. | 174/257 |
| 6,740,964 B2 | 5/2004 | Sasaki | |
| 6,753,612 B2 | 6/2004 | Adae-Amoakoh et al. | 257/774 |
| 6,787,443 B1 | 9/2004 | Boggs et al. | 438/612 |
| 6,803,528 B1 | 10/2004 | Koyanagi | 174/262 |
| 6,804,881 B1 | 10/2004 | Shipley et al. | 29/830 |
| 6,815,709 B2 | 11/2004 | Clothier et al. | 257/40 |
| 6,815,739 B2 | 11/2004 | Huff et al. | 257/275 |
| 6,822,334 B2 | 11/2004 | Hori et al. | 257/775 |
| 6,891,261 B2 | 5/2005 | Awaya | 257/692 |
| 6,913,952 B2 | 7/2005 | Moxham et al. | 438/125 |
| 6,919,514 B2 | 7/2005 | Konrad et al. | |
| 6,930,256 B1 | 8/2005 | Huemoeller et al. | 174/260 |
| 6,930,257 B1 | 8/2005 | Hiner et al. | 174/262 |
| 6,940,170 B2 | 9/2005 | Parikh | 257/750 |
| 6,989,593 B2 | 1/2006 | Khan et al. | 257/707 |
| 6,998,335 B2 | 2/2006 | Fan et al. | 438/612 |
| 7,028,400 B1 | 4/2006 | Hiner et al. | 29/852 |
| 7,033,928 B2 | 4/2006 | Kawano | 438/637 |
| 7,145,238 B1 | 12/2006 | Huemoeller et al. | 257/750 |
| 7,214,609 B2 | 5/2007 | Jiang et al. | 438/637 |
| 7,242,081 B1 | 7/2007 | Lee | |
| 7,345,361 B2 | 3/2008 | Mallik et al. | |
| 7,372,151 B1 | 5/2008 | Fan et al. | |
| 2001/0041436 A1* | 11/2001 | Parikh | 438/600 |
| 2002/0017712 A1 | 2/2002 | Bessho et al. | 257/700 |

| | | | |
|---|---|---|---|
| 2003/0000738 A1 | 1/2003 | Rumsey et al. | 174/260 |
| 2003/0128096 A1 | 7/2003 | Mazzochette | 338/22 |
| 2005/0194353 A1 | 9/2005 | Johnson et al. | 216/5 |
| 2005/0205295 A1* | 9/2005 | Tsuk | 174/256 |
| 2006/0157854 A1* | 7/2006 | Takewaki et al. | 257/758 |
| 2007/0114203 A1 | 5/2007 | Kang | |
| 2007/0273049 A1 | 11/2007 | Khan et al. | |
| 2007/0290376 A1 | 12/2007 | Zhao et al. | |
| 2008/0230887 A1 | 9/2008 | Sun et al. | |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

Huemoeller et al., U.S. Appl. No. 11/045,402, filed Jan. 28, 2005, entitled "Method for Making a Semiconductor Package Substrate Having a Printed Circuit Pattern Atop and Within a Dielectric".

Hiner et al., U.S. Appl. No. 11/098,995, filed Apr. 5, 2005, entitled "Method for Making an Integrated Circuit Substrate Having Laminated Laser-Embedded Circuit Layers".

Huemoeller et al., U.S. Appl. No. 11/166,005, filed Jun. 24, 2005, entitled "Circuit-on-Foil Process for Manufacturing a Laminated Semiconductor Package Substrate having Embedded Conductive Patters".

Huemoeller et al., U.S. Appl. No. 11/182,985, filed Jul. 14, 2005, entitled "Semiconductor Package Having Laser-Embedded Terminals".

Huemoeller et al., U.S. Appl. No. 11/189,593, filed Jul. 26, 2005, entitled "Integral Plated Semiconductor Package Substrate Stiffener".

Huemoeller et al., U.S. Appl. No. 11/527,827, filed Sep. 26, 2006, entitled "Semiconductor Package and Substrate Having Multi-Level Vias Fabrication Method".

Rusli et al., U.S. Appl. No. 11/621,402, filed Jan. 9, 2007, entitled "Embedded Circuit Pattern Fabrication Method and Structure".

Wolf et al., "Silicon Processing for the VLSI Era: vol. 1- Process Technology", 1986, pp. 407-408.

Huemoeller et al., U.S. Appl. No. 12/151,857, filed May 9, 2008, entitled "Multi-Level Circuit Substrate and Fabrication Method".

Huemoeller et al., U.S. Appl. No. 11/982,637, filed Nov. 1, 2007, entitled "Circuit-on-Foil Process for Manufacturing a Laminated Semiconductor Package Substrate Having Embedded Conductive Patterns".

Huemoeller et al., U.S. Appl. No. 11/903,002, filed Sep. 19, 2007, entitled "Substrate having Stiffener Fabrication Method".

IBM Technical Disclosure Bulletin, "Microstructure Solder Mask by Means of a Laser", vol. 36, Issue 11, p. 589, Nov. 1, 1993. (NN9311589).

Hiner et al., "Extended Landing Pad Substrate Package Structure and Method", U.S. Appl. No. 12/351,596, filed Jan. 9, 2009.

Berry et al., "Thin Stacked Interposer Package", U.S. Appl. No. 11/865,617, filed Oct. 1, 2007.

Scanlan, "Package-on-package (PoP with Through-mold Vias", *Advanced Packaging*, Jan. 2008, 3 pages, vol. 17, Issue 1, PennWell Corporation.

Kim et al., "Application of Through Mold Via (TMV) as PoP base package", *58th ECTC Proceedings*, May 2008, Lake Buena Vista, FL, 6 pages, IEEE.

* cited by examiner

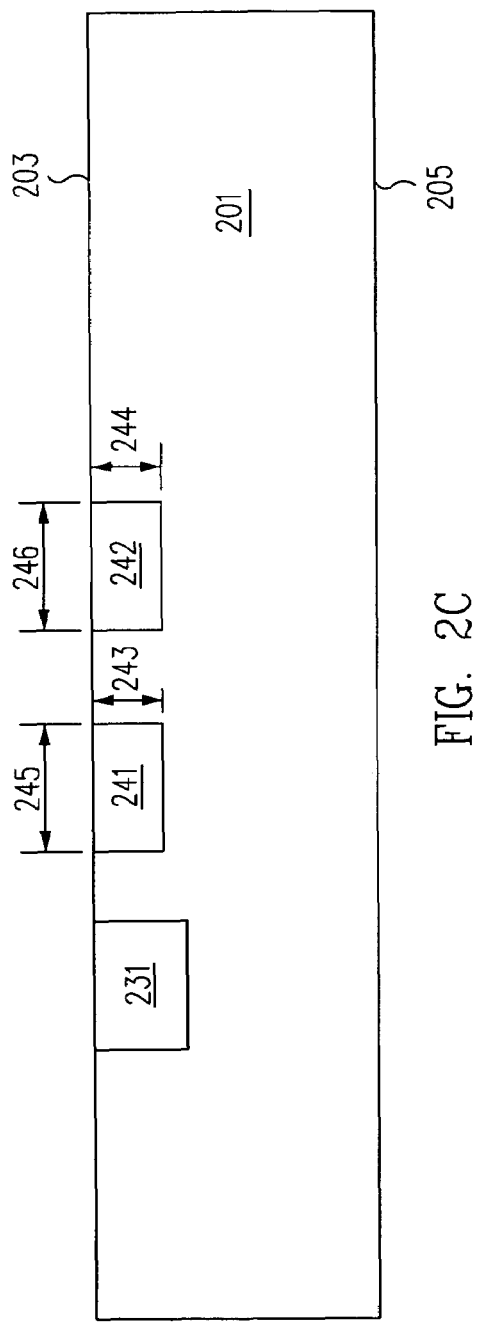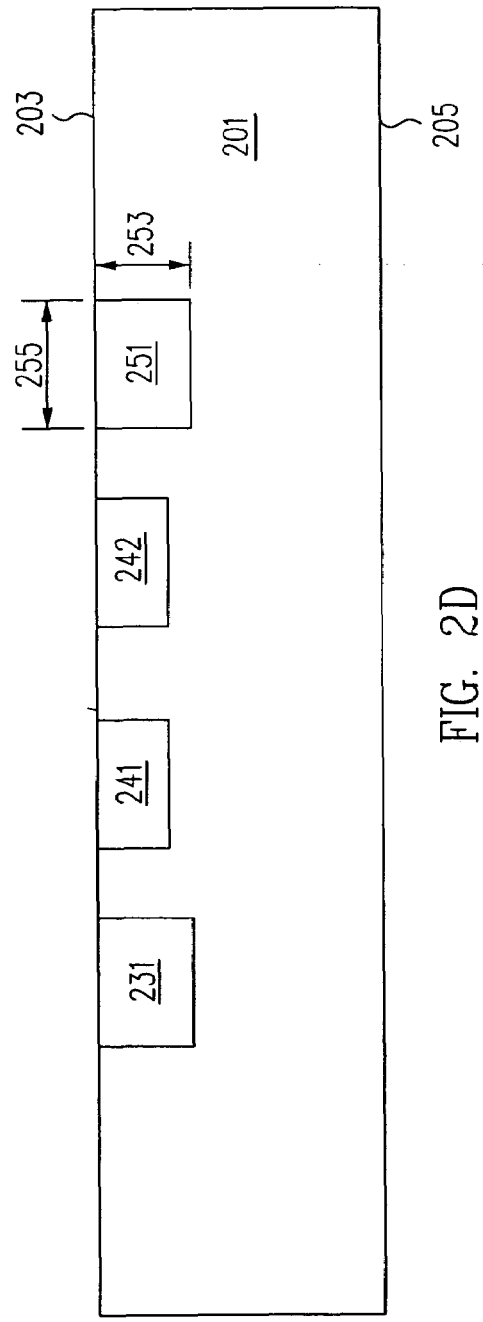

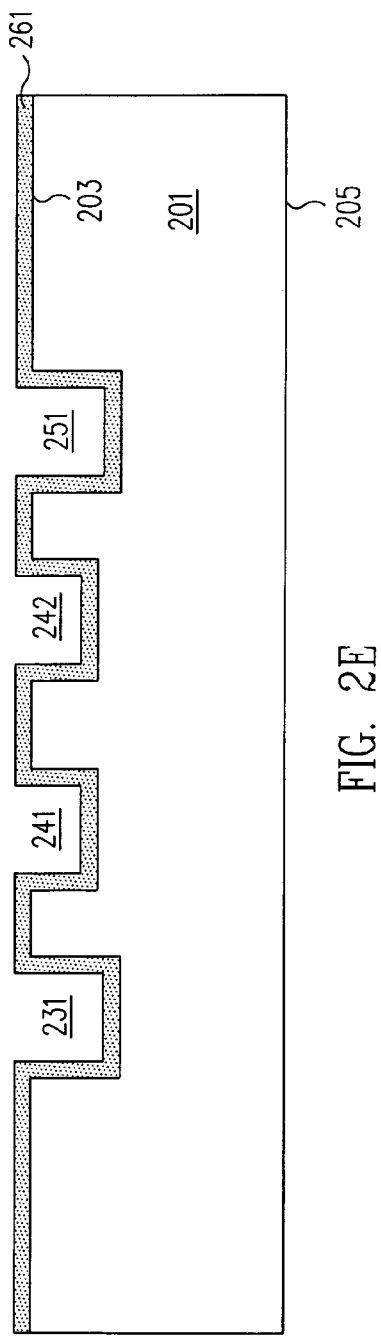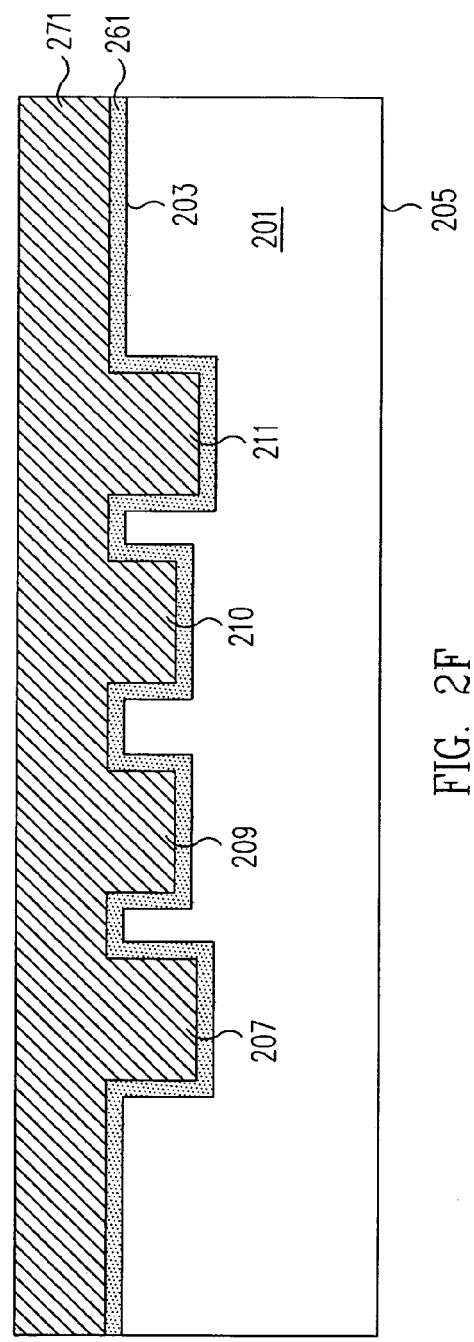

EMBEDDED METAL FEATURES STRUCTURE

BACKGROUND

1. Field

The present invention relates to the field of integrated circuits and packaging and, in particular, to metal trace and feature formation processes and structures.

2. Description of Related Art

As the electronic arts have moved to smaller and lighter weight devices, it has become increasingly important that integrated circuits and integrated circuit packages process greater numbers of signals and provide for greater density of signal routing features such as signal traces and bias traces associated with substrates used in both integrated circuits and integrated circuit packages. As a result, it is desirable to minimize the width of signal and bias traces and place as many signal traces as possible on a given substrate. However, this means electrical properties, such as impedance and shielding provided by the bias traces must be more accurately controlled.

Currently used substrates typically include a substrate first surface and a substrate second surface, opposite the substrate first surface with a substrate body, or thickness, between the two surfaces. Currently used substrates also typically include bias traces, such as ground and/or power and/or voltage potential traces, and signal traces, such as input/output (I/O), or data, signal traces formed on one of the substrate surfaces, such as the substrate first surface, as well as a bias plane, such as a ground and/or power and/or voltage potential plane, attached to the opposite substrate surface, such as the substrate second surface. As a result, an electric field between the bias traces, the signal traces, and the bias plane has a generally vertical orientation and the electrical properties provided by the bias traces, such as impedance control and shielding, are provided in vertically offset planes of bias traces and signal traces, typically offset by the thickness of the substrate.

What is needed is a method and apparatus that allows for greater accuracy and control of the electrical properties provided by bias traces.

SUMMARY

According to one embodiment, a method and structure for creating embedded metal features includes a dielectric layer wherein bias and signal traces are embedded in a first surface of the dielectric layer and extend into the dielectric layer.

According to one embodiment, bias trace and signal trace trenches are formed into the dielectric layer using LASER ablation, or other ablation, techniques. Using ablation techniques to form the bias and signal trace trenches, as disclosed herein, allows for extremely accurate control of the depth, width, shape, and horizontal displacement of the bias and signal trace trenches, often on the order of a single micron. As a result, the distance between the bias traces and the signal traces eventually formed in the trenches, and therefore the electrical properties, such as impedance and noise shielding, provided by the bias traces, can also be very accurately controlled. In addition, the depth of the bias and signal traces can also be very accurately controlled for better, and more accurate, signal shielding. Consequently, using the embedded trace substrates disclosed herein, the ability to accurately control the electrical properties provided by the bias traces is greatly improved over current structures; in one embodiment on the order of a ten-fold increase in accuracy is achieved.

In addition, using the method and structure for creating embedded metal features disclosed herein, significant improvements in substrate miniaturization can be achieved. This is because, using the method and structure for creating embedded metal features disclosed herein, the bias trace and signal trace structures are co-planar and this helps to reduce typical differential line widths by 20% to 50% compared with currently used structures. This reduction leads to reduced substrate layer counts and/or reduced overall integrated circuit package size.

In addition, as discussed above, the impedance for currently used substrates is controlled by a ground/bias layer, in contrast, using the method and structure for creating embedded metal features disclosed herein, the impedance is controlled by the surrounding, and co-planar, bias traces. As a result, any cut or discontinuity of the surface under the signal traces will not effect the impedance of the signal traces.

In addition, using the method and structure for creating embedded metal features disclosed herein, strong coupling between bias traces and signal traces is provided. This is because, in one embodiment, the signals are routed in a coplanar structure with a given signal trace "sandwiched" between two bias traces, so the signal trace is guarded by two surrounding bias traces, in one embodiment by a spacing on the order of 10 micrometers. This shortened distance between signal and bias traces provided by the method and structure for creating embedded metal features disclosed herein creates a strong coupling, especially when compared with the typical 35 micrometer spacing for current substrates.

In addition, since the bias and signal traces of the embedded trace substrates disclosed herein are embedded in the dielectric layer, the horizontal width of the bias traces at the dielectric layer surface can be accurately controlled and/or minimized. Therefore, more bias and signal traces can be formed in a given dielectric layer while, at the same time, providing improved electrical performance.

In addition, using the method and structure for creating embedded metal features disclosed herein, improved, i.e., decreased, crosstalk among signal traces results because, using the method and structure for creating embedded metal features disclosed herein, in one embodiment, a bias trace is positioned between signal traces. As a result, crosstalk between signal traces is minimized as the bias trace absorbs the electromagnetic waves between the trace signals.

In one embodiment, an embedded trace substrate includes one or more bias traces embedded in the dielectric layer such that a first surface of the one or more bias traces is substantially level with, or slightly above or below, a first surface of the dielectric layer and the one or more bias traces extend into the dielectric layer.

In one embodiment, an embedded trace substrate includes one or more signal traces embedded in the dielectric layer such that a first surface of the one or more signal traces is substantially level with, or slightly above or below, a first surface of the dielectric layer.

As noted above, according to one embodiment, the bias and signal traces are embedded into the dielectric layer itself using ablation techniques that provide accuracy tolerances on the order of a single micron. As a result, the electrical properties of bias traces can be accurately controlled by the precise placement of the bias trace with respect to the corresponding signal trace, and by accurately controlling the depths of the bias traces within the dielectric layer. Consequently, the embedded trace substrates disclosed herein provide a mechanism for controlling impedance levels and shielding provided by the bias traces with much tighter tolerances than are provided by current structures.

In addition, the embedded trace substrates disclosed herein allow shielding and impedance control of signal traces in the same horizontal plane. In addition, the embedded trace substrates disclosed herein reduce the need for additional metal layers to provide horizontal displacement of signal and bias traces, connect bias signals, or to manage electric signal performance. Therefore, the embedded trace substrates disclosed herein improve electrical performance in a simpler structure, with fewer elements to potentially fail.

In addition, as discussed in more detail below, using the below embodiments, with little or no modification, there is considerable flexibility, adaptability, and opportunity for customization to meet the specific needs of various users of the invention under numerous circumstances.

BRIEF DESCRIPTION OF THE DRAWINGS

FIG. 2C shows a representation of a cutaway side view of a partially processed substrate structure after first and second signal trace trenches have been formed into the first surface of the structure of FIG. 2B in accordance with the principles of one embodiment;

FIG. 2D shows a representation of a cutaway side view of a partially processed substrate structure after a second bias trace trench has been formed into the first surface of the structure of FIG. 2C in accordance with the principles of one embodiment;

FIG. 2E shows a representation of a cutaway side view of a partially processed substrate structure after a seed layer has been applied to a first surface of the substrate structure of FIG. 2D, including the surfaces of the first bias trace trench, first and second signal trenches, and second bias trace trench in accordance with the principles of one embodiment;

FIG. 2F shows a representation of a cutaway side view of a partially processed substrate structure after a layer of conductive material has been applied to a first surface of the substrate structure of FIG. 2E, and filled the first bias trace trench, the first and second signal trenches, and the second bias trace trench with conductive material, thereby forming a first bias trace, first and second signal traces, and a second bias trace, in accordance with the principles of one embodiment;

Figure 1A:
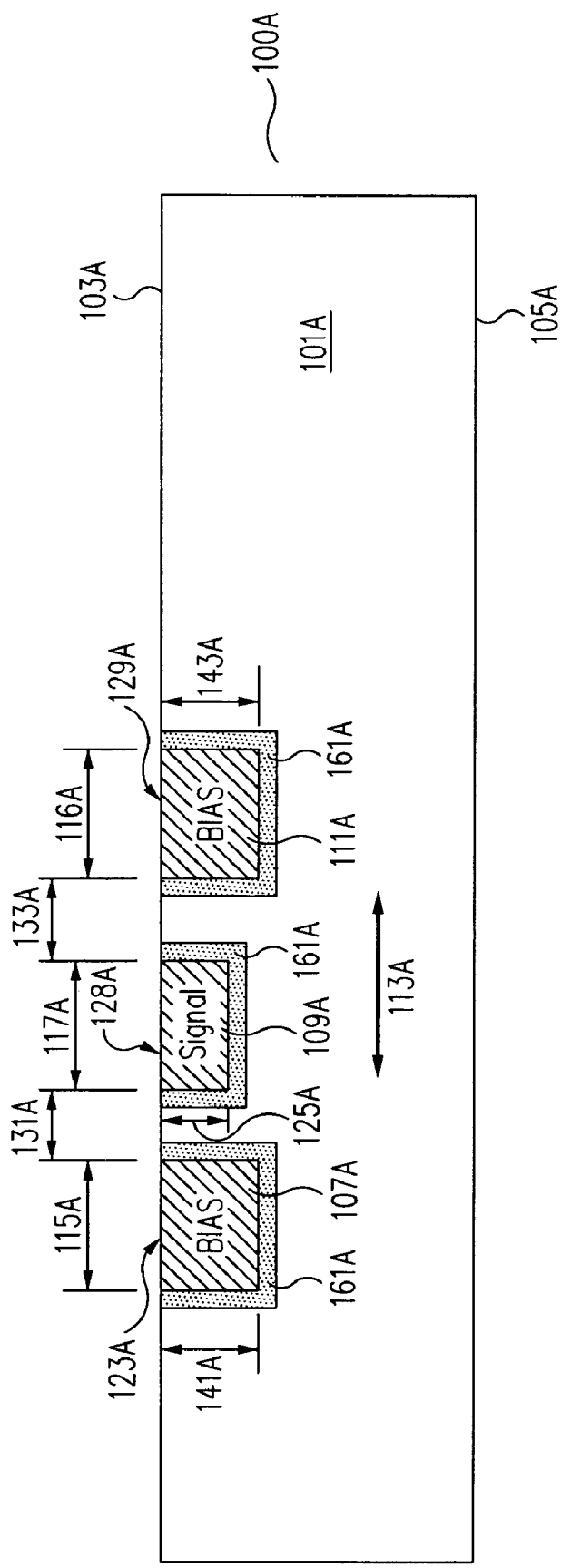
FIG. 1A shows a representation of a cutaway side view of an embedded trace substrate in accordance with the principles of one embodiment.

Common reference numerals are used throughout the FIG.s and the detailed description to indicate like elements. One skilled in the art will readily recognize that the above FIG.s are examples and that other structures, orders of fabrication and elements/functions can be provided and implemented without departing from the characteristics and features of the invention, as set forth in the claims.

DETAILED DESCRIPTION

According to one embodiment, a method and structure for creating embedded metal features includes embedded trace substrates (100A in FIG. 1A, 100B in FIG. 1B, 200 in FIG. 2G, 300 in FIG. 3, 400 in FIG. 4, 500 in FIG. 5A, 600 in FIG. 6L, 700 in FIG. 7 and 800 in FIG. 8) wherein bias and signal traces are embedded in a first surface of a dielectric layer of the embedded trace substrate and extend into the dielectric layer.

As used herein, the term "bias" refers to any electrical potential such as ground or power, and the term "bias trace" includes any bias traces, such as ground and/or power and/or voltage potential traces. In addition, as used herein, "bias plane" includes any bias plane structure, such as ground and/or power and/or voltage potential plane. In addition, the term "signal trace" includes any trace capable of conducting, transmitting, propagating, or otherwise carrying or transferring an electrical signal or data.

According to one embodiment, bias trace and signal trace trenches are formed into the dielectric layer of the substrate body using LASER ablation, or other ablation, techniques. Using ablation techniques to form the bias and signal trace trenches, as disclosed herein, allows for extremely accurate control of the depth, width, shape, and horizontal displacement of the bias and signal trace trenches, often on the order of a single micron. As a result, the distance between the bias traces and the signal traces eventually formed in the trenches, and therefore the electrical properties, such as impedance and noise shielding, provided by the bias traces, can also be very accurately controlled. In addition, the depth of the bias and signal traces can also be very accurately controlled for better, and more accurate, signal shielding. Consequently, using the embedded trace substrates disclosed herein, the ability to accurately control the electrical properties provided by the bias traces is greatly improved over current structures; in one embodiment on the order of a ten-fold increase in accuracy is achieved.

In addition, since the bias and signal traces of the embedded trace substrates disclosed herein are embedded in the embedded trace substrate, the horizontal width of the bias traces at the embedded trace substrate surface can be accurately controlled and/or minimized. Therefore, more bias and signal traces can be formed in a given embedded trace substrate while, at the same time, providing improved electrical performance.

In addition, using the method and structure for creating embedded metal features disclosed herein, significant improvements in substrate miniaturization can be achieved. This is because, using the method and structure for creating embedded metal features disclosed herein, the bias trace and signal trace structures are co-planar and this helps to reduce typical differential line widths by 20% to 50% compared with currently used structures. This reduction leads to reduced substrate layer counts and/or reduced overall integrated circuit package size.

In addition, as discussed above, the impedance for currently used substrates is controlled by a ground/bias layer, in contrast, using the method and structure for creating embedded metal features disclosed herein, the impedance is controlled by the surrounding and co-planar bias traces. As a result, any cut or discontinuity of the surface under the signal traces will not effect the impedance of the signal traces.

In addition, using the method and structure for creating embedded metal features disclosed herein, strong coupling between bias traces and signal traces is provided. This is because, in one embodiment, the signals are routed in a coplanar structure with a given signal trace "sandwiched" between two bias traces, so the signal trace is guarded by two surrounding bias traces, in one embodiment at a spacing on the order of 10 micrometers. This shortened distance between signal and bias traces provided by the method and structure for creating embedded metal features disclosed herein creates a strong coupling, especially when compared with the typical 35 micrometer spacing for current substrates.

In addition, since the bias and signal traces of the embedded trace substrates disclosed herein are embedded in the dielectric layer, the horizontal width of the bias traces at the dielectric layer surface can be accurately controlled and/or minimized. Therefore, more bias and signal traces can be formed in a given dielectric layer while, at the same time, providing improved electrical performance.

In addition, using the method and structure for creating embedded metal features disclosed herein, improved, i.e., decreased, crosstalk among signal traces results because, using the method and structure for creating embedded metal features disclosed herein, in one embodiment, a bias trace is positioned between signal traces. As a result, crosstalk between signal traces is minimized as the bias trace absorbs the electromagnetic waves between the trace signals.

In one embodiment, an embedded trace substrate includes at least one bias trace embedded in the dielectric layer of the embedded trace substrate body such that a first surface of the at least one bias trace is substantially level with, or slightly above or below, a first surface of the embedded trace substrate and the at least one bias trace extends into the dielectric layer.

In one embodiment, an embedded trace substrate includes at least one signal trace embedded in the dielectric layer of the embedded trace substrate such that a first surface of the at least one signal trace is substantially level with, or slightly above or below, a first surface of the embedded trace substrate.

As noted above, according to one embodiment, the bias and signal traces are embedded into the dielectric layer of the embedded trace substrate body itself using ablation techniques that provide accuracy tolerances on the order of a single micron. As a result, the electrical properties of bias traces can be accurately controlled by the precise placement of the bias trace with respect to the corresponding signal trace, and by accurately controlling the depths of the bias traces within the embedded trace substrate body. Consequently, the embedded trace substrates disclosed herein provide a mechanism for controlling impedance levels and shielding provided by the bias traces with much tighter tolerances than are provided by current structures.

In addition, the embedded trace substrates disclosed herein allow shielding and impedance control of signal traces in the same horizontal plane. In addition, the embedded trace substrates disclosed herein reduce the need for additional metal layers to provide horizontal displacement of signal and bias traces, connect bias signals, or to manage electric signal performance. Therefore, the embedded trace substrates disclosed herein improve electrical performance in a simpler structure, with fewer elements to potentially fail.

In particular, FIG. 1A shows a representation of a cutaway side view of an embedded trace substrate 100A in accordance with the principles of one embodiment. As shown in FIG. 1A, embedded trace substrate 100A includes: dielectric layer first surface 103A; dielectric layer second surface 105A, opposite dielectric layer first surface 103A; dielectric layer 101A, positioned between dielectric layer first surface 103A and dielectric layer second surface 105A; first bias trace 107A; second bias trace 111A; first signal trace 109A; and portions of seed layer 161A.

In one embodiment, dielectric layer 101A is made of any of the numerous substrate materials known to those of skill in the art such as Prepreg, or any other primarily dielectric material, whether known at the time of filing or developed later. As discussed in more detail below, in one embodiment, seed layer 161A is applied to prepare dielectric layer 101A to receive a conductive layer. In one embodiment, seed layer 161A is a layer of metal, such as copper. In other embodiments, seed layer 161A can be any metal or other material desired, whether known at the time of filing or as developed later. In one embodiment, first bias trace 107A, first signal trace 109A, and second bias trace 111A are made of conductive material, such as a metal, filling trenches formed by LASER ablation, as discussed in more detail below.

As shown in FIG. 1A, in one embodiment, first bias trace 107A includes a first bias trace first surface 123A that is substantially level with, or slightly above or below, dielectric layer first surface 103A. In one embodiment, first bias trace 107A is embedded within dielectric layer 101A of embedded trace substrate 100A a first bias trace depth 141A below dielectric layer first surface 103A. First bias trace 107A also includes a horizontal width 115A.

As also shown in FIG. 1A, in one embodiment, second bias trace 111A includes a second bias trace first surface 129A that is substantially level with, or slightly above or below, dielectric layer first surface 103A. In one embodiment, second bias trace 111A is embedded within embedded trace substrate body 101A a second bias trace depth 143A below dielectric layer first surface 103A. Second bias trace 111A also includes a horizontal width 116A As also shown in FIG. 1A, in one embodiment, first signal trace 109A includes a first signal trace first surface 128A that is substantially level with, or slightly above or below, dielectric layer first surface 103A. In one embodiment, first signal trace 109A is embedded within dielectric layer 101A of embedded trace substrate 100A a first signal trace depth 125A below dielectric layer first surface 103A. First signal trace 109A also includes a horizontal width 117A. As also shown in FIG. 1A, in one embodiment, first signal trace 109A is positioned horizontally between first bias trace 107A and second bias trace 111A such that an electric field between first bias trace 107A, first signal trace 109A and second bias trace 111A is oriented horizontally as shown by arrow 113A.

Also show in FIG. 1A are first horizontal spacing 131A between first bias trace 107A and first signal trace 109A; and second horizontal spacing 133A between first signal trace 109A and second bias trace 111A. As noted above, according to one embodiment, first bias trace 107A, first signal trace 109A, and second bias trace 111A are formed into substrate body 101A using LASER ablation, or other ablation, techniques. Using ablation techniques to form first bias trace 107A, first signal trace 109A, and second bias trace 111A, as disclosed herein, allows for very accurate control, on the order of a single micron, of first horizontal spacing 131A and second horizontal spacing 133A, as well as first bias trace horizontal width 115A, first signal trace horizontal width 117A, and second bias trace horizontal width 116A. Consequently, the control impedance provided by first bias trace 107A and second bias trace 111A can also be very accurately controlled; in some embodiments, to the order of a single ohm.

In addition, using ablation techniques to form first bias trace 107A, first signal trace 109A, and second bias trace 111A, as disclosed herein, allows for very accurate control, on the order of a single micron, of: first bias trace depth 141A; second bias trace depth 143A; and first signal trace depth 125A. Consequently, the shielding provided by first bias trace 107A and second bias trace 111A can also be very accurately controlled. In addition, using ablation techniques to form first bias trace 107A, first signal trace 109A, and second bias trace 111A, as disclosed herein, allows for very accurate control, on the order of a single micron, of: first bias trace horizontal width 115A; first signal trace horizontal width 117A; and second bias trace horizontal width 116A. This fact also provides for tighter impedance tolerances.

Figure 1B:
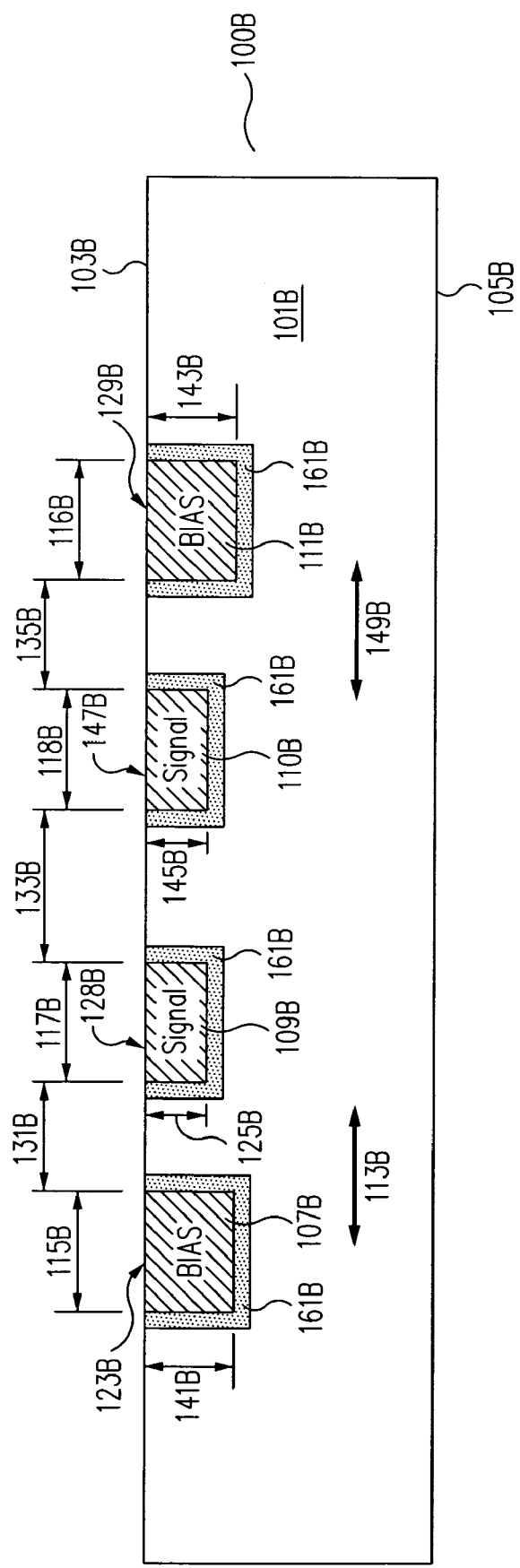
FIG. 1B shows a representation of a cutaway side view of an embedded trace substrate in accordance with the principles of one embodiment.

In other embodiments, it is desirable to include more than one signal trace, such as first signal trace 109A of embedded trace substrate 100A, in an embedded trace substrate. In particular, FIG. 1B shows a representation of a cutaway side view of an embedded trace substrate 100B in accordance with the principles of one embodiment. As shown in FIG. 1B, embedded trace substrate 100B includes: dielectric layer first surface 103B; dielectric layer second surface 105B, opposite dielectric layer first surface 103B; dielectric layer 101B, positioned between dielectric layer first surface 103B and dielectric layer second surface 105B; first bias trace 107B; second bias trace 111B; first signal trace 109B; second signal trace 110B; and portions of seed layer 161B.

In one embodiment, dielectric layer 101B is made of any of the numerous substrate materials known to those of skill in the art such as Prepreg, or any other primarily dielectric substrate material, whether known at the time of filing or developed later. As discussed in more detail below, in one embodiment, seed layer 161B is applied to prepare dielectric layer 101B to receive a conductive layer. In one embodiment, seed layer 161B is a layer of metal, such as copper. In other embodiments, seed layer 161B can be any metal or other material desired, whether known at the time of filing or as developed later. In one embodiment, first bias trace 107B, first signal trace 109B, second signal trace 110B, and second bias trace 111B are made of conductive material, such as a metal, filling trenches formed by LASER ablation, as discussed in more detail below.

As shown in FIG. 1B, in one embodiment, first bias trace 107B includes a first bias trace first surface 123B that is substantially level with, or slightly above or below, dielectric layer first surface 103B. In one embodiment, first bias trace 107B is embedded within dielectric layer 101B of embedded trace substrate 100B a first bias trace depth 141B below dielectric layer first surface 103B. First bias trace 107B also includes a first bias trace horizontal width 115B.

As also shown in FIG. 1B, in one embodiment, second bias trace 111B includes a second bias trace first surface 129B that is substantially level with, or slightly above or below, dielectric layer first surface 103B. In one embodiment, second bias trace 111B is embedded within dielectric layer 101B a second bias trace depth 143B below dielectric layer first surface 103B. Second bias trace 111B also includes a second bias trace horizontal width 116B As also shown in FIG. 1B, in one embodiment, first signal trace 109B includes a first signal trace first surface 128B that is substantially level with, or slightly above or below, dielectric layer first surface 103B. In one embodiment, first signal trace 109B is embedded within dielectric layer 101B of embedded trace substrate 100B a first signal trace depth 125B below dielectric layer first surface 103B. First signal trace 109B also includes a first signal trace horizontal width 117B.

As also shown in FIG. 1B, in one embodiment, second signal trace 110B includes a second signal trace first surface 147B that is substantially level with, or slightly above or below, dielectric layer first surface 103B. In one embodiment, second signal trace 110B is embedded within dielectric layer 101B of embedded trace substrate 100B a second signal trace depth 145B below dielectric layer first surface 103B. Second signal trace 110B also includes a second signal trace horizontal width 118B.

As also shown in FIG. 1B, in one embodiment, first signal trace 109B is positioned horizontally between first bias trace 107B and second signal trace 110B. In addition, second signal trace 110B is positioned horizontally between first signal trace 109B and second bias trace 111B. Consequently, an electric field between first bias trace 107B and first signal trace 109B and second signal trace 110B and second bias trace 111B is oriented horizontally as shown by arrows 113B and 149B.

Also show in FIG. 1B are first horizontal spacing 131B between first bias trace 107B and first signal trace 109B; second horizontal spacing 133B between first signal trace 109B and second signal trace 110B; and third horizontal spacing 135B between second signal trace 110B and second bias trace 111B. As noted above, according to one embodiment, first bias trace 107B, first signal trace 109B, second signal trace 110B, and second bias trace 111B are formed in dielectric layer 101B using LASER ablation, or other ablation, techniques. Using ablation techniques to form first bias trace 107B, first signal trace 109B, second signal trace 110B, and second bias trace 111B, as disclosed herein, allows for very accurate control, on the order of a single micron, of first horizontal spacing 131B, second horizontal spacing 133B, and third horizontal spacing 135B. Consequently, the impedance provided by first bias trace 107B and second bias trace 111B can also be very accurately controlled; in some embodiments, to the order of a single ohm.

In addition, using ablation techniques to form first bias trace 107B, first signal trace 109B, second signal trace 110B, and second bias trace 111B, as disclosed herein, allows for very accurate control, on the order of a single micron, of: first bias trace depth 141B; second bias trace depth 143B; first signal trace depth 125B; and second signal trace depth 145B Consequently, the shielding provided by first bias trace 107B and second bias trace 111B can also be very accurately controlled. In addition, using ablation techniques to form first bias trace 107B, first signal trace 109B, second signal trace 110B, and second bias trace 111B, as disclosed herein, allows for very accurate control, on the order of a single micron, of: first bias trace horizontal width 115B; first signal trace horizontal width 117B; second signal trace horizontal width 118B, and second bias trace horizontal width 116B. This fact also provides for tighter impedance tolerances.

As discussed above, using ablation techniques to form the bias and signal trace trenches, as disclosed herein, the depth, width, shape, and horizontal displacement of the bias and signal trace trenches can be controlled extremely accurately, on the order of a single micron. Therefore, the horizontal distance, such as horizontal distances 131A, 133A, 131B, 133B, and 135B, between the bias traces and the signal traces, such as bias traces 107A, 111A, 107B and 111B and signal traces 109A, 109B and 110B of FIGS. 1A and 1B, eventually formed in the trenches, and therefore the signal control impedance provided by the bias traces, can be very accurately controlled. In addition, the depth of the bias traces can also be very accurately controlled for better, and more accurate, signal shielding. Consequently, using embedded trace substrates 100A and 100B, the ability to accurately control the electrical properties provided by the bias traces is greatly improved over current bias traces. In one embodiment on the order of a ten-fold increase in accuracy is achieved.

In addition, since the bias and signal traces disclosed herein are embedded in the embedded trace substrate, the horizontal width of the bias traces, such as widths 115A, 115B, 117A, 117B, 116A, 116B and 118B of FIGS. 1A and 1B, at the embedded trace substrate surface, such as dielectric layer first surfaces 103A and 103B of embedded trace substrates 100A and 100B, can be minimized. Therefore, more bias and signal traces can be formed in a given embedded trace substrate while, at the same time, providing improved electrical performance.

In addition, embedded trace substrates 100A and 100B provide for in-horizontal plane electrical management versus the alternate horizontal plane, vertically displaced, electrical management of currently used substrates. That is to say, since first bias traces 107A and 107B are horizontally displaced from signal traces 109A, 109B, and 110B, and second bias traces 111A and 111B, the electric control field between the traces is horizontally oriented.

In addition, the structure of embedded trace substrates 100A and 100B allows shielding of signal traces, such as first signal trace 109A, first signal trace 109B, and second signal trace 110B, to bias traces, such as first bias traces 107A and 107B and second bias traces 111A and 111B, in the same horizontal plane. In addition, the structure of embedded trace substrates 100A and 100B reduces the need for additional metal layers to connect bias signals or to manage electric signal performance and therefore the structure of embedded trace substrates 100A and 100B improve electrical performance without added structural complexity.

In addition, the structure of embedded trace substrates 100A and 100B allows for significant improvements in substrate and package miniaturization. This is because, with the structure of embedded trace substrates 100A and 100B, the bias traces 107A, 111A, 107B, 111B and signal traces 109A, 109B, 110B are co-planar and this fact helps to reduce trace widths 115A, 117A, 116A, 115B, 117B, 118B, 116B, as well as spacings 131A, 133A, 131B, 133B, 135B, by 20% to 50% compared with currently used structures. This reduction leads to reduced dielectric layer counts and/or reduced overall integrated circuit package size.

In addition, as discussed above, the impedance for currently used substrates is controlled by a ground/bias layer, in contrast, the structure of embedded trace substrates 101A and 100B allows the impedance to be controlled by the surrounding and co-planar bias traces 107A, 111A, 107B, 111B. As a result, any cut or discontinuity of the surface under the signal traces 109A, 109B, 110B will not effect the impedance of signal traces 109A, 109B, 110B.

In addition, the structure of embedded trace substrate 100A allows strong coupling between bias traces 107A, 111A and signal trace 109A. This is because, in one embodiment, the signals are routed in a coplanar structure with a given signal trace 109A, "sandwiched" between two bias traces 107A, 111A, so the signal trace 109A is guarded by two surrounding bias traces 107A, 111A, in one embodiment by a spacing 131A, 133A on the order of 10 micrometers. This shortened distance between signal and bias traces provided by the method and structure for creating embedded metal features disclosed herein creates a strong coupling, especially when compared to the typical 35 micrometer spacing for current substrates.

In addition, since the bias and signal traces 107A, 111A, 107B, 111B and 109A, 109B, 110B of embedded trace substrates 100A and 100B are embedded in dielectric layer 101A, 101B, the horizontal width 115A, 117A, 116A, 115B, 117B, 118B, 116B of the bias and signal traces 107A, 111A, 107B, 111B and 109A, 109B, 110B at dielectric layer first surface 103A, 103B can be accurately controlled and/or minimized. Therefore, more bias and signal traces 107A, 111A, 107B, 111B and 109A, 109B, 110B can be formed in a given dielectric layer 101A, 101B while, at the same time, providing improved electrical performance.

In addition, the structure of embedded trace substrates 100A and 100B provides improved, i.e., decreased, crosstalk among signal traces 109A, 109B, 110B because, in one embodiment, a bias trace 107A, 111A, 107B, 111B is positioned between signal traces 109A, 109B, 111B. As a result, crosstalk between signal traces is minimized as the bias trace absorbs the electromagnetic waves between the trace signals.

FIGS. 2A, 2B, 2C, 2D, 2E, 2F, and 2G together are a representation of some of the fabrication stages making up one embodiment of a method for creating an embedded trace substrate, such as embedded trace substrates 100A and/or 100B of FIG. 1A and FIG. 1B, respectively.

Figure 2A:
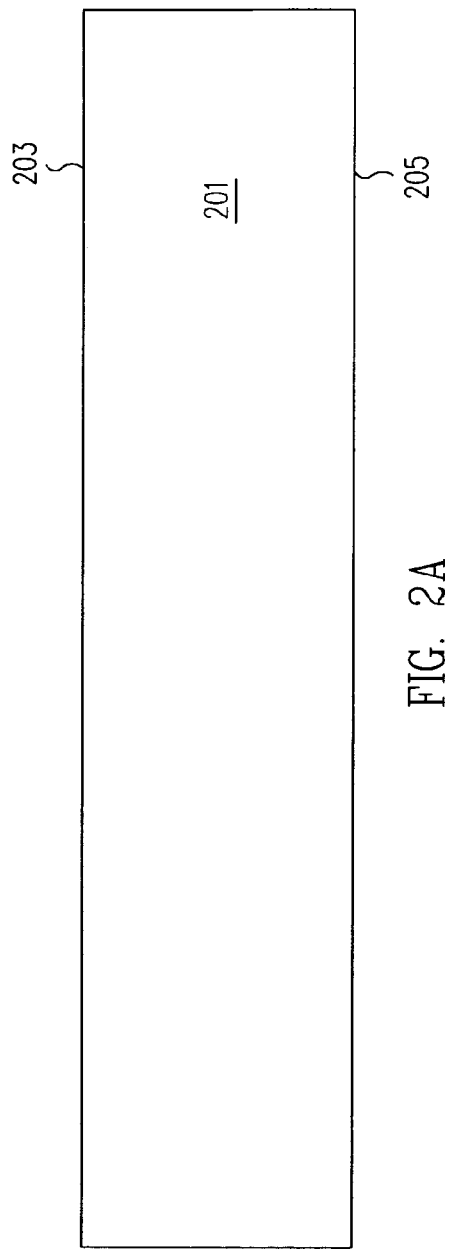
FIG. 2A shows a representation of a cutaway side view of a substrate prior to processing in accordance with the principles of one embodiment.

FIG. 2A shows a representation of a cutaway side view of a substrate prior to processing in accordance with the principles of one embodiment of a method for creating an embedded trace substrate.

As shown in FIG. 2A, and as discussed above, substrate includes dielectric layer first surface 203 and dielectric layer second surface 205, opposite dielectric layer first surface 203, and separated from dielectric layer first surface 203 by dielectric layer 201. As discussed above, dielectric layer 201 is made of any of the numerous substrate materials known to those of skill in the art such as Prepreg, or any other primarily dielectric substrate material, whether known at the time of filing or as later developed.

Figure 2B:
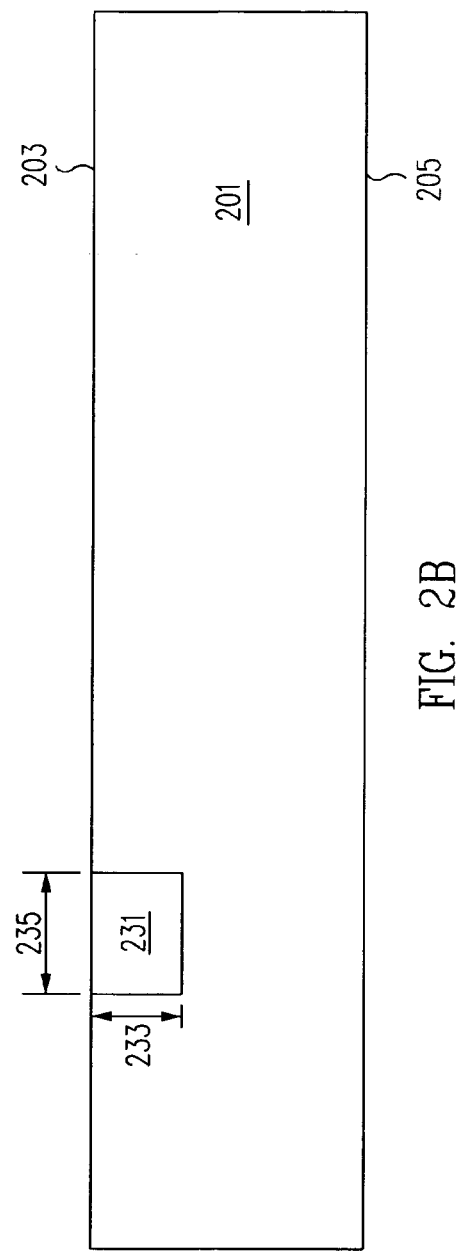
FIG. 2B shows a representation of a cutaway side view of a partially processed substrate structure after a first bias trace trench has been formed into the first surface of the substrate of FIG. 2A in accordance with the principles of one embodiment.

FIG. 2B shows a representation of a cutaway side view of a partially processed substrate structure after a first bias trace trench 231 has been ablated into dielectric layer first surface 203 of the substrate of FIG. 2A in accordance with the principles of one embodiment.

Returning to FIG. 2B, in one embodiment, first bias trace trench 231 is formed with a first bias trace trench depth 233 into dielectric layer 201 and with a first bias trace trench horizontal width 235 at dielectric layer first surface 203. In one embodiment, first bias trace trench 231 is created using LASER ablation or any other method for ablating, etching, scratching, digging, or otherwise forming a trench into a substrate, whether known at the time of filing or as developed later.

FIG. 2C shows a representation of a cutaway side view of a partially processed substrate structure after a first signal trace trench 241 and a second signal trace trench 242 have been ablated into dielectric layer first surface 203 of the structure of FIG. 2B in accordance with the principles of one embodiment.

Returning to FIG. 2C, in one embodiment, first signal trace trench 241 is formed with a first signal trace trench depth 243 into dielectric layer 201 and with a first signal trace trench horizontal width 245 at dielectric layer first surface 203. In one embodiment, first signal trace trench 241 is created using LASER ablation or any other method for ablating, etching, scratching, digging, or otherwise forming a trench into a substrate, whether known at the time of filing or as developed later.

Likewise, in one embodiment, second signal trace trench 242 is formed with a second signal trace trench depth 244 into dielectric layer 201 and with a second signal trace trench horizontal width 246 at dielectric layer first surface 203. In one embodiment, second signal trace trench 242 is created using LASER ablation or any other method for ablating, etching, scratching, digging, or otherwise forming a trench into a substrate, whether known at the time of filing or as developed later.

FIG. 2D shows a representation of a cutaway side view of a partially processed substrate structure after a second bias trace trench 251 has been ablated into dielectric layer first surface 203 of the structure of FIG. 2C in accordance with the principles of one embodiment.

Returning to FIG. 2D, in one embodiment, second bias trace trench 251 is formed with a second bias trace trench depth 253 into dielectric layer 201 and with a second bias trace trench horizontal width 255 at dielectric layer first surface 203. In one embodiment, second bias trace trench 251 is created using LASER ablation or any other method for ablating, etching, scratching, digging, or otherwise forming a trench into a substrate, whether known at the time of filing or as developed later.

FIG. 2E shows a representation of a cutaway side view of a partially processed substrate structure after a seed layer 261 has been applied to dielectric layer first surface 203 of the structure of FIG. 2D, including the surfaces of first bias trace trench 231, first signal trench 241, second signal trench 242, and second bias trace trench 251, in accordance with the principles of one embodiment.

Returning to FIG. 2E, seed layer 261 is applied to prepare dielectric layer first surface 203 to receive a conductive layer. In one embodiment, seed layer 261 is a layer of metal, such as copper. In other embodiments, seed layer 261 can be any metal or other conductive material desired, whether known at the time of filing or as developed later. Methods, apparatuses, and structures associated with applying a seed layer, such as seed layer 261, to a substrate are well known to those of skill in the art. Consequently, a more detailed discussion of the application of seed layers to a substrate is omitted here to avoid detracting from the invention.

FIG. 2F shows a representation of a cutaway side view of a partially processed substrate structure after a layer of conductive material 271 has been applied to dielectric layer first surface 203, and seed layer 261 (FIG. 2E), of the substrate structure of FIG. 2E, and filled first bias trace trench 231 (FIG. 2E), first signal trench 241 (FIG. 2E), second signal trench 242 (FIG. 2E) and second bias trace trench 251 (FIG. 2E) with conductive material, thereby forming first bias trace 207 (FIG. 2F), first signal trace 209 (FIG. 2F), second signal trace 210 (FIG. 2F) and second bias trace 211 (FIG. 2F), in accordance with the principles of one embodiment.

In one embodiment, layer of conductive material 271 is a layer of metal, such as copper. In other embodiments, layer of conductive material 271 can be any metal or other conductive material desired, whether known at the time of filing or as developed later. Methods, apparatuses, and structures associated with applying a layer of conductive material, such as layer of conductive material 271, to a substrate, are well known to those of skill in the art. Consequently, a more detailed discussion of the application of layers of conductive material to a substrate is omitted here to avoid detracting from the invention.

Figure 2G:
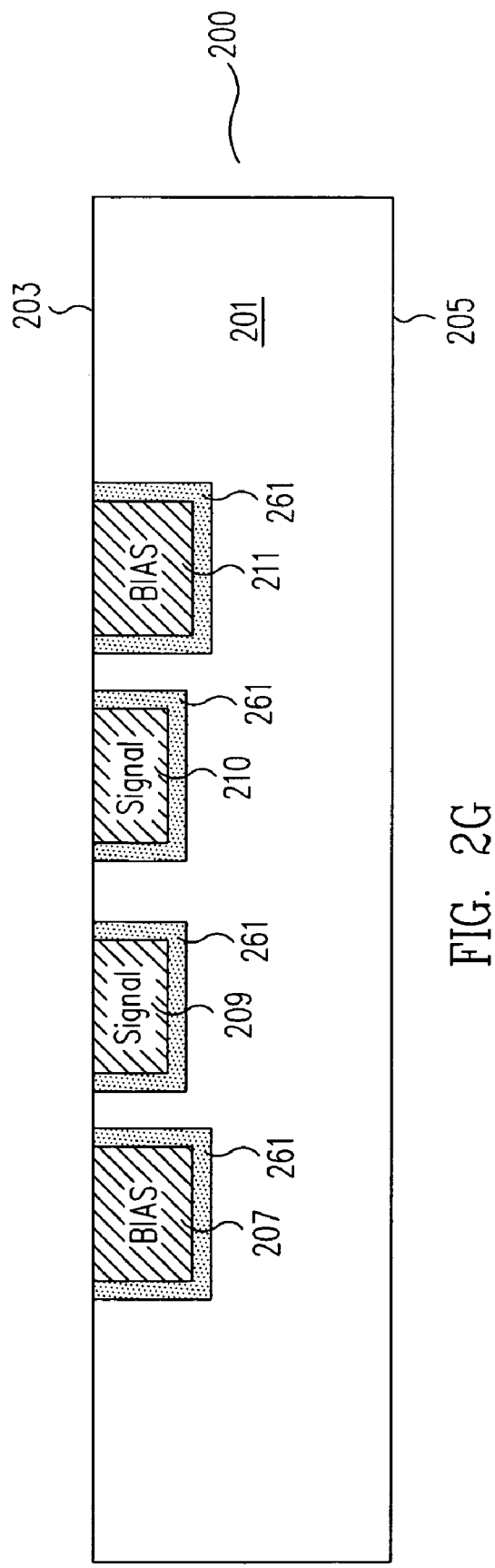
FIG. 2G shows a representation of a cutaway side view of the structure of FIG. 2F after excess conductive material has been removed to yield an embedded trace substrate in accordance with one embodiment.

FIG. 2G shows a representation of a cutaway side view of the structure of FIG. 2F after excess conductive material of layer of conductive material 271 has been removed to yield embedded trace substrate 200 in accordance with one embodiment. In one embodiment, the excess conductive material of layer of conductive material 271 of FIG. 2F is removed using any process for removing conductive material, such as grinding, etching, scraping or any other mechanical or chemical process, whether known at the time of filing or as developed thereafter.

Embedded trace substrates 100A, 100B discussed above with respect to FIG. 1A, FIG. 1B, respectively, include first bias traces 107A, 107B having first bias trace depths 141A, 141B that are shown, in the particular examples of FIG. 1A and FIG. 1B, as being substantially similar to second bias trace depths 143A, 143B of second bias traces 111A, 111B. However, those of skill in the art will readily recognize that the depths of bias traces need not be the same, or even similar, and that in some cases it may be desirable to have significantly different depths for the various bias traces to form a multi-depth embedded trace substrate to provide a multiple electrical properties feature. Since according to one embodiment, the bias and signal traces are embedded in the substrate, and the bias and signal trenches are formed using ablation methods, such as LASER ablation, the depth of the bias and signal traces can be very accurately controlled. Consequently, a variety of depths of bias and signal traces can be created in a single substrate to meet the various needs of the user.

Figure 3:
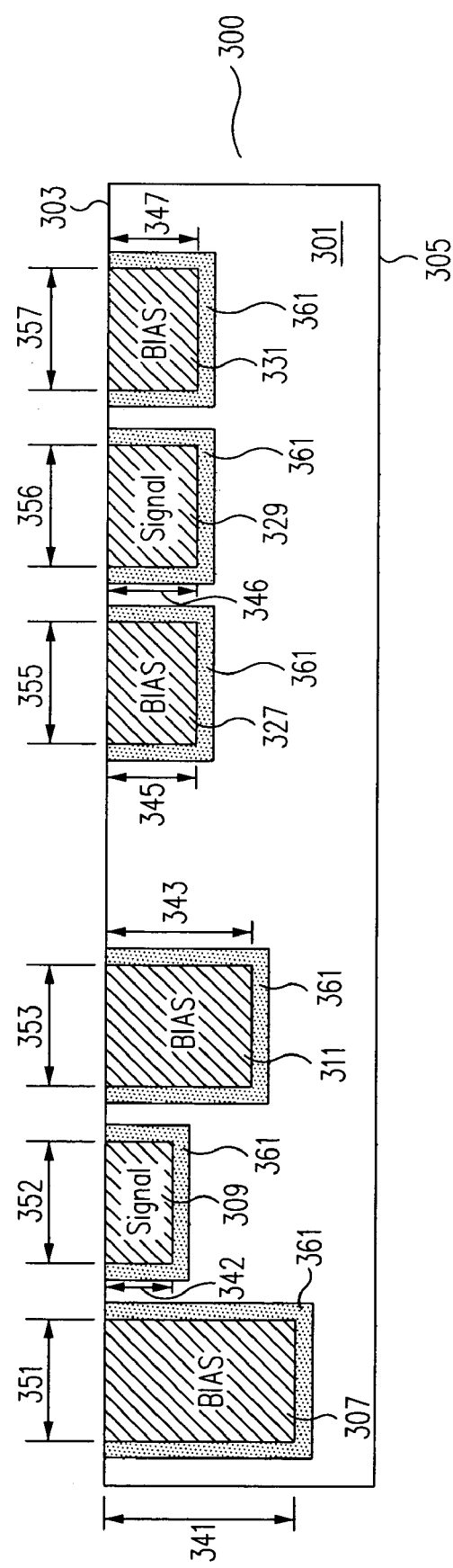
FIG. 3 shows a representation of a cutaway side view of a multi-depth embedded trace substrate in accordance with the principles of one embodiment.

For example, FIG. 3 shows a representation of a cutaway side view of a multi-depth embedded trace substrate 300 in accordance with the principles of one embodiment. As shown in FIG. 3, multi-depth embedded trace substrate 300 includes: dielectric layer first surface 303; dielectric layer second surface 305, opposite dielectric layer first surface 303; dielectric layer 301, positioned between dielectric layer first surface 303 and dielectric layer second surface 305; first bias trace 307; second bias trace 311; first signal trace 309; third bias trace 327; fourth bias trace 331; second signal trace 329; and portions of seed layer 361.

In one embodiment, dielectric layer 301 is made of any of the numerous substrate materials known to those of skill in the art such as Prepreg, or any other primarily dielectric substrate material, whether known at the time of filing or developed later. As discussed in more detail above, in one embodiment, seed layer 361 is applied to prepare dielectric layer 301 to receive a conductive layer. In one embodiment, seed layer 361 is a layer of metal, such as copper. In other embodiments, seed layer 361 can be any metal or other material desired, whether known at the time of filing or as developed later. In one embodiment, first bias trace 307, first signal trace 309, second bias trace 311, third bias trace 327, fourth bias trace 331, and second signal trace 329 are made of conductive material, such as a metal, filling trenches formed by LASER ablation, as discussed in more detail above.

As shown in FIG. 3, in one embodiment, first bias trace 307 is embedded within dielectric layer 301 of multi-depth embedded trace substrate 300 a first bias trace depth 341 below dielectric layer first surface 303. First bias trace 307 also has a first bias trace horizontal width 351.

As also shown in FIG. 3, in one embodiment, second bias trace 311 is embedded within dielectric layer 301 of multi-depth embedded trace substrate 300 a second bias trace depth 343 below dielectric layer first surface 303. In addition, in this particular exemplary embodiment, second bias trace depth 343 is less than first bias trace depth 341. Second bias trace 311 also has a second bias trace horizontal width 353.

As also shown in FIG. 3, in one embodiment, first signal trace 309 is embedded within dielectric layer 301 of multi-depth embedded trace substrate 300 a first signal trace depth 342 below dielectric layer first surface 303. As also shown in FIG. 3, in one embodiment, first signal trace 309 is positioned horizontally between first bias trace 307 and second bias trace 311 and has a first signal trace horizontal width 352.

As also shown in FIG. 3, in one embodiment, third bias trace 327 is embedded within dielectric layer 301 of multi-depth embedded trace substrate 300 a third bias trace depth 345 below dielectric layer first surface 303. Third bias trace 327 also has a third bias trace horizontal width 355.

As also shown in FIG. 3, in one embodiment, fourth bias trace 331 is embedded within dielectric layer 301 of multi-depth embedded trace substrate 300 a fourth bias trace depth 347 below dielectric layer first surface 303. In addition, in this particular exemplary embodiment, fourth bias trace depth 347 is substantially the same as third bias trace depth 345. Fourth bias trace 331 also has a fourth bias trace horizontal width 357.

As also shown in FIG. 3, in one embodiment, second signal trace 329 is embedded in dielectric layer 301 of multi-depth embedded trace substrate 300 a second signal trace depth 346 below dielectric layer first surface 303. In one embodiment, second signal trace depth 346 is different from first signal trace depth 342. In one embodiment, second signal trace depth 346 is substantially the same as fourth bias trace depth 347 and third bias trace depth 345. As also shown in FIG. 3, in one embodiment, second signal trace 329 is positioned horizontally between third bias trace 327 and fourth bias trace 331.

In some instances it may be desirable to induce both an electric field having a horizontal orientation and an electric field having a vertical orientation. In one embodiment, this is accomplished by adding a bias plane to a second surface of an embedded trace substrate.

Figure 4:
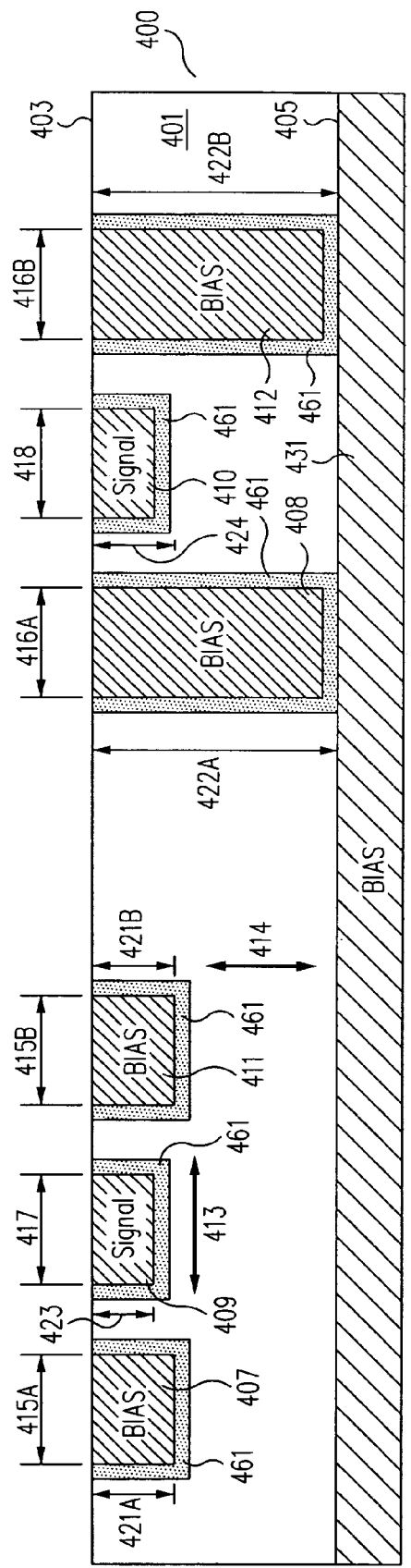
FIG. 4 shows a representation of a cutaway side view of an embedded trace substrate with bias plane in accordance with the principles of one embodiment.

FIG. 4 shows a representation of a cutaway side view of an embedded trace substrate 400 with bias plane 431 in accordance with the principles of one embodiment. As shown in FIG. 4, embedded trace substrate 400 with bias plane 431 includes: dielectric layer first surface 403; dielectric layer second surface 405, opposite dielectric layer first surface 403; dielectric layer 401, positioned between dielectric layer first surface 403 and dielectric layer second surface 405; first bias trace 407; second bias trace 411; first signal trace 409; third bias trace 408; fourth bias trace 412; second signal trace 410; bias plane 431; and portions of seed layer 461.

In one embodiment, embedded trace substrate with dielectric layer 401 is made of any of the numerous substrate materials known to those of skill in the art such as Prepreg, or any other primarily dielectric substrate material, whether known at the time of filing or developed later. As discussed in more detail above, in one embodiment, seed layer 461 is applied to prepare dielectric layer 401 to receive a conductive layer. In one embodiment, seed layer 461 is a layer of metal, such as copper. In other embodiments, seed layer 461 can be any metal or other material desired, whether known at the time of filing or as developed later. In one embodiment, first bias trace 407, first signal trace 409, second bias trace 411, third bias trace 408, fourth bias trace 412, second signal trace 410, and bias plane 431 are made of conductive material, such as a metal, filling trenches or forming an applied layer and/or formed by LASER ablation, as discussed in more detail above.

As shown in FIG. 4, in one embodiment, first bias trace 407 is embedded within dielectric layer 401 of embedded trace substrate 400 with bias plane 431 a first bias trace depth 421A below dielectric layer first surface 403. First bias trace 407 also has a first bias trace horizontal width 415A.

As also shown in FIG. 4, in one embodiment, second bias trace 411 is embedded within dielectric layer 401 of embedded trace substrate 400 with bias plane 431 a second bias trace depth 421B below dielectric layer first surface 403. In addition, in this particular exemplary embodiment, second bias trace depth 421B is substantially similar to first bias trace depth 421A. Second bias trace 411 also has a second bias trace horizontal width 415B.

As also shown in FIG. 4, in one embodiment, first signal trace 409 is embedded within dielectric layer 401 of embedded trace substrate 400 with bias plane 431 a first signal trace depth 423 below dielectric layer first surface 403. First signal trace 409 also has a first signal trace horizontal width 417. As also shown in FIG. 4, in one embodiment, first signal trace 409 is positioned horizontally between first bias trace 407 and second bias trace 411.

As also shown in FIG. 4, in one embodiment, bias plane 431 is attached, or formed, or applied, on embedded trace substrate with bias plane second surface 405 by methods well known to those of skill in the art. The location of bias plane 431 on dielectric layer second surface 405 creates a vertically orientated electric field between first bias trace 407, second bias trace 411, and first signal trace 409 and bias plane 431 as indicated by arrow 414. This vertically orientated electric field is in addition to the horizontally oriented electric field between first bias trace 407, first signal trace 409 and second bias trace 411 as indicated by arrow 413.

As shown in FIG. 4, in one embodiment, third bias trace 408 is embedded within dielectric layer 401 of embedded trace substrate 400 with bias plane 431 a third bias trace depth 422A below dielectric layer first surface 403 such that third bias trace 408 is in electrical contact with bias plane 431. Third bias trace 408 also has a third bias trace horizontal width 416A.

As also shown in FIG. 4, in one embodiment, fourth bias trace 412 is embedded within dielectric layer 401 of embedded trace substrate 400 with bias plane 431 a fourth bias trace depth 422B below dielectric layer first surface 403 such that fourth bias trace 412 is also in electrical contact with bias plane 431. Fourth bias trace 412 also has a fourth bias trace horizontal width 416B.

As also shown in FIG. 4, in one embodiment, second signal trace 410 is embedded within dielectric layer 401 of embedded trace substrate 400 with bias plane 431 a second signal trace depth 424 below dielectric layer first surface 403. Second signal trace 410 also has a second signal trace horizontal width 418. As also shown in FIG. 4, in one embodiment, second signal trace 410 is positioned horizontally between third bias trace 408 and fourth bias trace 412.

Figure 5A:
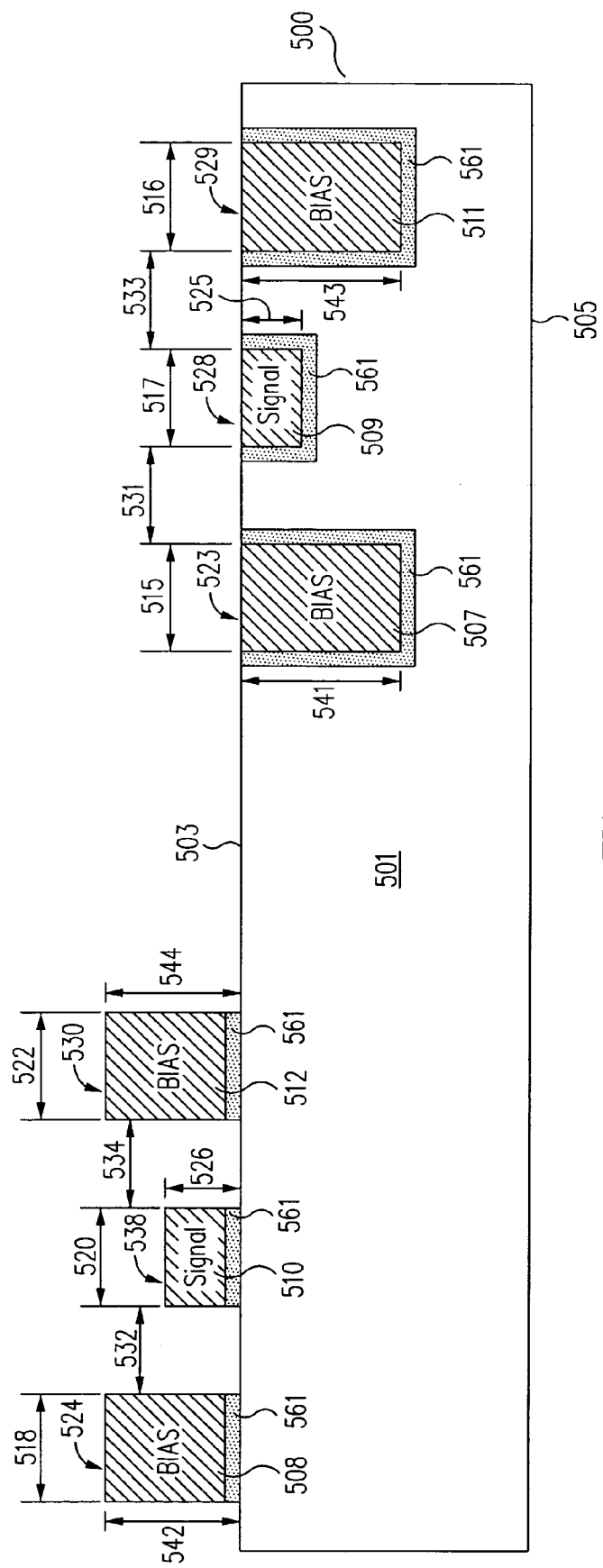
FIG. 5A shows a representation of a cutaway side view of an in-plane and out-of-plane embedded trace substrate in accordance with the principles of one embodiment.

In some instances, it is desirable to create a substrate structure wherein bias traces and signal traces are formed in and out of a given horizontal plane. FIG. 5A shows a representation of a cutaway side view of an in-plane and out-of-plane embedded trace substrate 500 in accordance with the principles of one embodiment. As shown in FIG. 5A, in-plane and out-of-plane embedded trace substrate 500 includes: dielectric layer first surface 503; dielectric layer second surface 505, opposite dielectric layer first surface 503; dielectric layer 501, positioned between dielectric layer first surface 503 and dielectric layer second surface 505; in-plane first bias trace 507; in-plane first signal trace 509; in-plane second bias trace 511; out-of-plane first bias trace 508; out-of-plane first signal trace 510; out-of-plane second bias trace 512; and portions of seed layer 561.

In one embodiment, dielectric layer 501 is made of any of the numerous substrate materials known to those of skill in the art such as Prepreg, or any other primarily dielectric substrate material, whether known at the time of filing or developed later. As discussed in more detail above, in one embodiment, seed layer 561 is applied to prepare dielectric layer 501 to receive a conductive layer. In one embodiment, seed layer 561 is a layer of metal, such as copper. In other embodiments, seed layer 561 can be any metal or other material desired, whether known at the time of filing or as developed later. In one embodiment, in-plane first bias trace 507, in-plane first signal trace 509, in-plane second bias trace 511, out-of-plane first bias trace 508, out-of-plane first signal trace 510, and out-of-plane second bias trace 512 are made of conductive material, such as a metal.

As shown in FIG. 5A, in one embodiment, in-plane first bias trace 507 includes an in-plane first bias trace first surface 523 that is substantially level with, or slightly above or below, dielectric layer first surface 503. In one embodiment, in-plane first bias trace 507 is embedded within dielectric layer 501 of in-plane and out-of-plane embedded trace substrate 500 an in-plane first bias trace depth 541 below dielectric layer first surface 503. In-plane first bias trace 507 includes in-plane bias trace horizontal width 515.

As also shown in FIG. 5A, in one embodiment, in-plane first signal trace 509 includes an in-plane first signal trace first surface 528 that is substantially level with, or slightly above or below, dielectric layer first surface 503. In one embodiment, in-plane first signal trace 509 is embedded within dielectric layer 501 of in-plane and out-of-plane embedded trace substrate 500 an in-plane first signal trace depth 525 below dielectric layer first surface 503. In-plane first signal trace 509 includes in-plane first signal trace 509 horizontal width 517

As shown in FIG. 5A, in one embodiment, in-plane second bias trace 511 includes an in-plane second bias trace first surface 529 that is substantially level with, or slightly above or below, dielectric layer first surface 503. In one embodiment, in-plane second bias trace 511 is embedded within dielectric layer 501 of in-plane and out-of-plane embedded trace substrate 500 an in-plane second bias trace depth 543 below dielectric layer first surface 503. In-plane second bias trace 511 includes in-plane bias trace horizontal width 516.

As also shown in FIG. 5A, in one embodiment, in-plane first signal trace 509 is positioned horizontally between in-plane first bias trace 507 and in-plane second bias trace 511.

Also show in FIG. 5A are first horizontal spacing 531 between in-plane first bias trace 507 and in-plane first signal trace 509; and second horizontal spacing 533 between in-plane first signal trace 509 and in-plane second bias trace 511. As noted above, according to one embodiment, in-plane first bias trace 507, in-plane first signal trace 509 and in-plane second bias trace 511 are formed using LASER ablation, or other ablation, techniques. Using ablation techniques to form in-plane first bias trace 507, in-plane first signal trace 509 and in-plane second bias trace 511, as disclosed herein, allows for very accurate control, on the order of a single micron, of first horizontal spacing 531 and second horizontal spacing 533. Consequently, the control impedance provided by in-plane first bias trace 507 and in-plane second bias trace 511 can also be very accurately controlled; in some embodiments, to the order of a single ohm.

In-plane first bias trace 507, in-plane first signal trace 509 and in-plane second bias trace 511 are similar to first bias trace 107A, first signal trace 109A and second bias trace 111A of FIG. 1A discussed above. Consequently the discussion of the characteristics, features, advantages and formation of first bias trace 107A, first signal trace 109A and second bias trace 111A of FIG. 1A are applicable to, and incorporated here for, in-plane first bias trace 507, in-plane first signal trace 509 and in-plane second bias trace 511 of FIG. 5A.

As also shown in FIG. 5A, in one embodiment, out-of-plane first bias trace 508 includes an out-of-plane first bias trace first surface 524 that is an out-of-plane first bias trace height 542 above dielectric layer first surface 503. In one embodiment, out-of-plane first bias trace 508 is in electrical contact with dielectric layer first surface 503. Out-of-plane first bias trace 508 includes an out-of-plane first bias trace horizontal width 518.

As also shown in FIG. 5A, in one embodiment, out-of-plane first signal trace 510 includes an out-of-plane first signal trace first surface 538 that is an out-of-plane first signal trace height 526 above dielectric layer first surface 503. In one embodiment, out-of-plane first signal trace 510 is in electrical contact with dielectric layer first surface 503. Out-of-plane first signal trace 510 includes out-of-plane first signal trace horizontal width 520.

As also shown in FIG. 5A, in one embodiment, out-of-plane second bias trace 512 includes an out-of-plane second bias trace first surface 530 that is an out-of-plane second bias trace height 544 above dielectric layer first surface 503. In one embodiment, out-of-plane second bias trace 512 is in electrical contact with dielectric layer first surface 503. Out-of-plane second bias trace 512 includes an out-of-plane second bias trace horizontal width 522.

As also shown in FIG. 5A, in one embodiment, out-of-plane first signal trace 510 is positioned horizontally between out-of-plane first bias trace 508 and out-of-plane second bias trace 512.

Also show in FIG. 5A are third horizontal spacing 532 between out-of-plane first bias trace 508 and out-of-plane first signal trace 510; and fourth horizontal spacing 534 between out-of-plane first signal trace 510 and out-of-plane second bias trace 512.

Figure 5B:
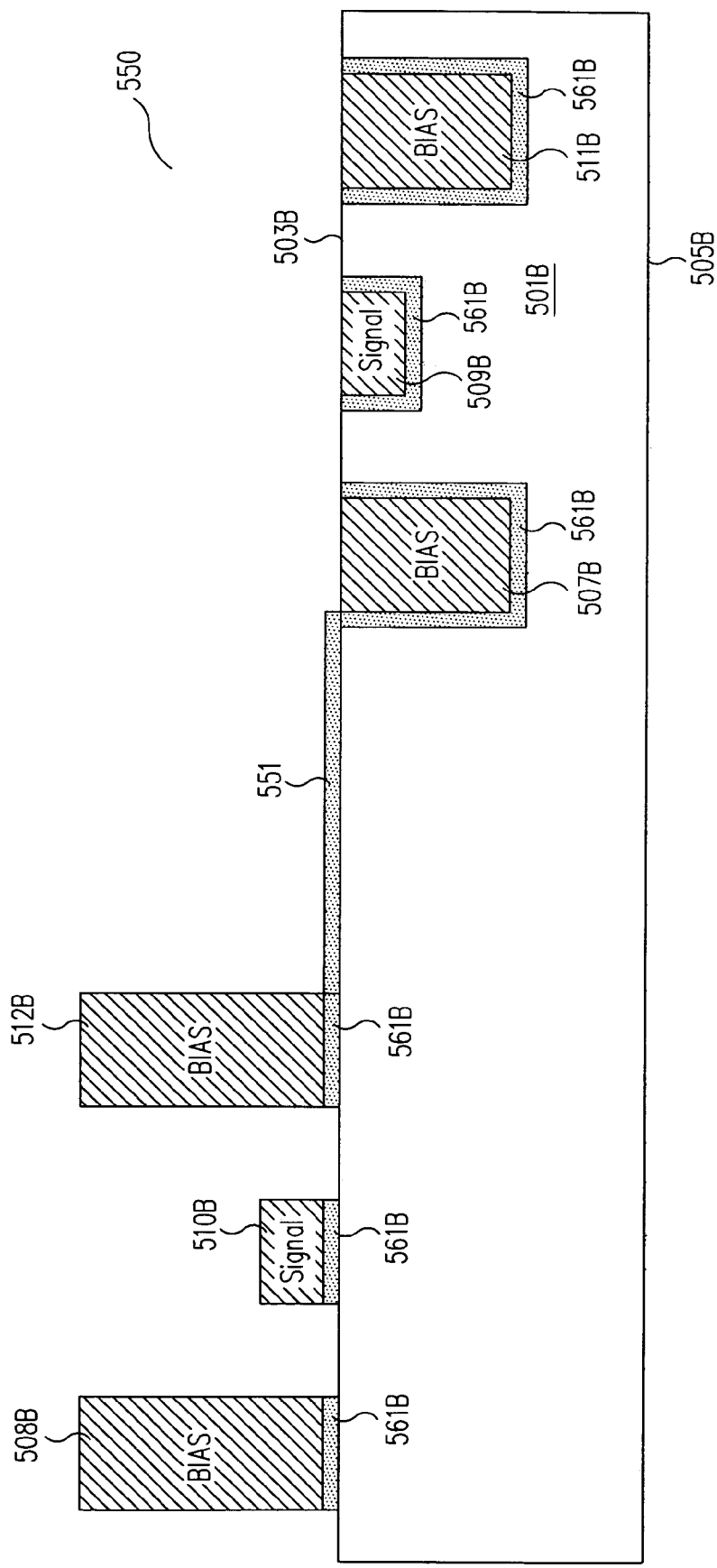
FIG. 5B shows a representation of a cutaway side view of an in-plane and out-of-plane embedded trace substrate in accordance with the principles of one embodiment.

In some instances, it is desirable to create a substrate structure wherein bias traces and signal traces are formed in and out of a given horizontal plane and two or more of the bias traces are electrically coupled. FIG. 5B shows a representation of a cutaway side view of an in-plane and out-of-plane embedded trace substrate 550 in accordance with the principles of one embodiment. As shown in FIG. 5B, in-plane and out-of-plane embedded trace substrate 550 includes: dielectric layer first surface 503B; dielectric layer second surface 505B, opposite dielectric layer first surface 503B; dielectric layer 501B, positioned between dielectric layer first surface 503B and dielectric layer second surface 505B; in-plane first bias trace 507B; in-plane first signal trace 509B; in-plane second bias trace 511B; out-of-plane first bias trace 508B; out-of-plane first signal trace 510B; out-of-plane second bias trace 512B; portions of seed layer 561B; and electrically conductive connector trace 551.

In one embodiment: dielectric layer first surface 503B; dielectric layer second surface 505B; dielectric layer 501B; in-plane first bias trace 507B; in-plane first signal trace 509B; in-plane second bias trace 511B; out-of-plane first bias trace 508B; out-of-plane first signal trace 510B; portions of seed layer 561B; and out-of-plane second bias trace 512B of in-plane and out-of-plane embedded trace substrate 550 of FIG. 5B are substantially similar to: dielectric layer first surface 503; dielectric layer second surface 505; dielectric layer 501; in-plane first bias trace 507; in-plane first signal trace 509; in-plane second bias trace 511; out-of-plane first bias trace 508; out-of-plane first signal trace 510; portions of seed layer 561; and out-of-plane second bias trace 512 of in-plane and out-of-plane embedded trace substrate 500 of FIG. 5A. Consequently, the discussion above with respect to: dielectric layer first surface 503; dielectric layer second surface 505; dielectric layer 501; in-plane first bias trace 507; in-plane first signal trace 509; in-plane second bias trace 511; out-of-plane first bias trace 508; out-of-plane first signal trace 510; portions of seed layer 561; and out-of-plane second bias trace 512 of in-plane and out-of-plane embedded trace substrate 500 of FIG. 5A is applicable to, and incorporated here for, similarly named and labeled elements: dielectric layer first surface 503B; dielectric layer second surface 505B; dielectric layer 501B; in-plane first bias trace 507B; in-plane first signal trace 509B; in-plane second bias trace 511B; out-of-plane first bias trace 508B; out-of-plane first signal trace 510B; portions of seed layer 561B; and out-of-plane second bias trace 512B of in-plane and out-of-plane embedded trace substrate 550 of FIG. 5B.

In one embodiment, dielectric layer 501B is made of any of the numerous substrate materials known to those of skill in the art such as Prepreg, or any other primarily dielectric substrate material, whether known at the time of filing or developed later. As discussed in more detail below, in one embodiment, seed layer 561B is applied to prepare dielectric layer 501B to receive a conductive layer. In one embodiment, seed layer 561B is a layer of metal, such as copper. In other embodiments, seed layer 561B can be any metal or other material desired, whether known at the time of filing or as developed later. In one embodiment, in-plane first bias trace 507B, in-plane first signal trace 509B, in-plane second bias trace 511B, out-of-plane first bias trace 508B, out-of-plane first signal trace 510B, and out-of-plane second bias trace 512B and electrically conductive connector trace 551 are made of conductive material, such as a metal. In one embodiment, connector trace 551 is a portion of seed layer 561B.

Figure 5C:
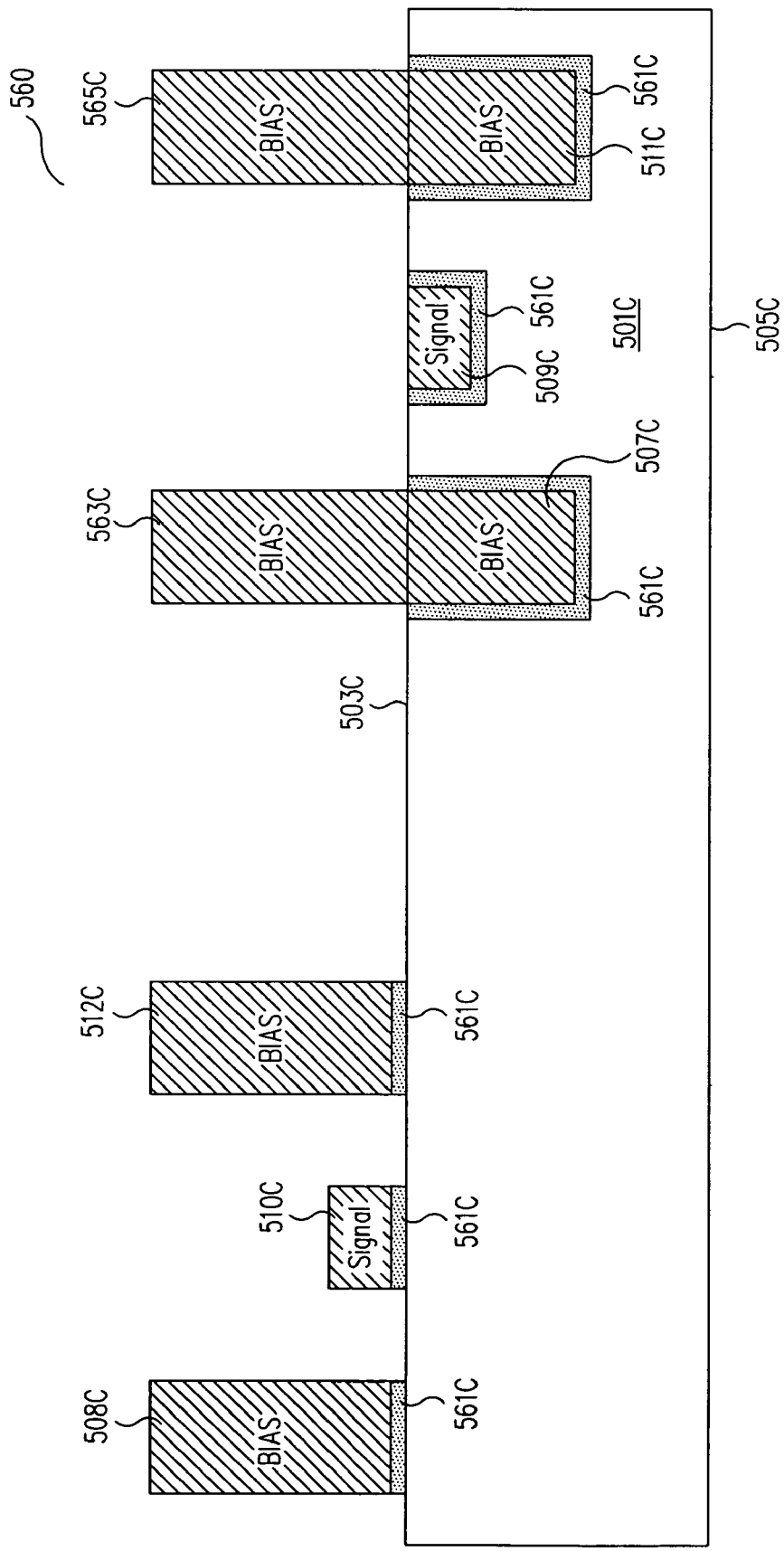
FIG. 5C shows a representation of a cutaway side view of an in-plane and out-of-plane embedded trace substrate in accordance with the principles of one embodiment.

In some instances, it is desirable to create a substrate structure wherein bias traces and signal traces are formed in and out of a given horizontal plane and one or more out-of-plane bias traces are formed directly above one or more in-plane bias traces. FIG. 5C shows a representation of a cutaway side view of an in-plane and out-of-plane embedded trace substrate 560 in accordance with the principles of one embodiment. As shown in FIG. 5C, in-plane and out-of-plane embedded trace substrate 560 includes: dielectric layer first surface 503C; dielectric layer second surface 505C, opposite dielectric layer first surface 503C; dielectric layer 501C, positioned between dielectric layer first surface 503C and dielectric layer second surface 505C; in-plane first bias trace 507C; in-plane first signal trace 509C; in-plane second bias trace 511C; out-of-plane first bias trace 508C; out-of-plane first signal trace 510C; out-of-plane second bias trace 512C; out-of-plane third bias trace 563C; out-of-plane fourth bias trace 565C; and portions of seed layer 561C.

In one embodiment: dielectric layer first surface 503C; dielectric layer second surface 505C; dielectric layer 501C; in-plane first bias trace 507C; in-plane first signal trace 509C; in-plane second bias trace 511C; out-of-plane first bias trace 508C; out-of-plane first signal trace 510C; out-of-plane second bias trace 512C; and portions of seed layer 561C of in-plane and out-of-plane embedded trace substrate 560 of FIG. 5C are substantially similar to: dielectric layer first surface 503; dielectric layer second surface 505; dielectric layer 501; in-plane first bias trace 507; in-plane first signal trace 509; in-plane second bias trace 511; out-of-plane first bias trace 508; out-of-plane first signal trace 510; out-of-plane second bias trace 512; and portions of seed layer 561 of in-plane and out-of-plane embedded trace substrate 500 of FIG. 5A. Consequently, the discussion above with respect to: dielectric layer first surface 503; dielectric layer second surface 505; dielectric layer 501; in-plane first bias trace 507; in-plane first signal trace 509; in-plane second bias trace 511; out-of-plane first bias trace 508; out-of-plane first signal trace 510; out-of-plane second bias trace 512; and portions of seed layer 561 of in-plane and out-of-plane embedded trace substrate 500 of FIG. 5A is applicable to, and incorporated here for, similarly named and labeled elements: dielectric layer first surface 503C; dielectric layer second surface 505C;

dielectric layer 501C; in-plane first bias trace 507C; in-plane first signal trace 509C; in-plane second bias trace 511C; out-of-plane first bias trace 508C; out-of-plane first signal trace 510C; out-of-plane second bias trace 512C; and portions of seed layer 561C of in-plane and out-of-plane embedded trace substrate 560 of FIG. 5C.

In one embodiment, dielectric layer 501C is made of any of the numerous substrate materials known to those of skill in the art such as Prepreg, or any other primarily dielectric substrate material, whether known at the time of filing or developed later. In one embodiment, seed layer 561C is applied to prepare dielectric layer first surface 503C to receive a conductive layer. In one embodiment, seed layer 561C is a layer of metal, such as copper. In other embodiments, seed layer 561C can be any metal or other conductive material desired, whether known at the time of filing or as developed later. In one embodiment, in-plane first bias trace 507C, in-plane first signal trace 509C, in-plane second bias trace 511C, out-of-plane first bias trace 508C, out-of-plane first signal trace 510C, out-of-plane second bias trace 512C, out-of-plane third bias trace 563C, and out-of-plane fourth bias trace 565C, are made of a conductive material, such as a metal.

As shown in FIG. 5C, in-plane and out-of-plane embedded trace substrate 560 includes out-of-plane third bias trace 563C and out-of-plane fourth bias trace 565C. In one embodiment, out-of-plane third bias trace 563C and out-of-plane fourth bias trace 565C are similar to out-of-plane first bias trace 508C and out-of-plane second bias trace 512C. However, in one embodiment, out-of-plane third bias trace 563C and out-of-plane fourth bias trace 565C are formed directly over in-plane first bias trace 507C and in-plane second bias trace 511C, respectively, to provide further shielding for in-plane first signal trace 509C, and, in particular, to shield out-of-plane electromagnetic field components produced by a signal on in-plane first signal trace 509C. Consequently, out-of-plane third bias trace 563C and out-of-plane fourth bias trace 565C provide more complete shielding of first signal trace 509C.

In one embodiment, one or more of the physical dimensions, such as width and height, of out-of-plane third bias trace 563C and out-of-plane fourth bias trace 565C are substantially similar to the physical dimensions of in-plane first bias trace 507C and in-plane second bias trace 511C and/or out-of-plane first bias trace 508C and out-of-plane second bias trace 512C. In other embodiments, the physical dimensions, such as width and height, of out-of-plane third bias trace 563C and out-of-plane fourth bias trace 565C are different, depending on the needs and desires of the user of the invention.

Figure 5D:
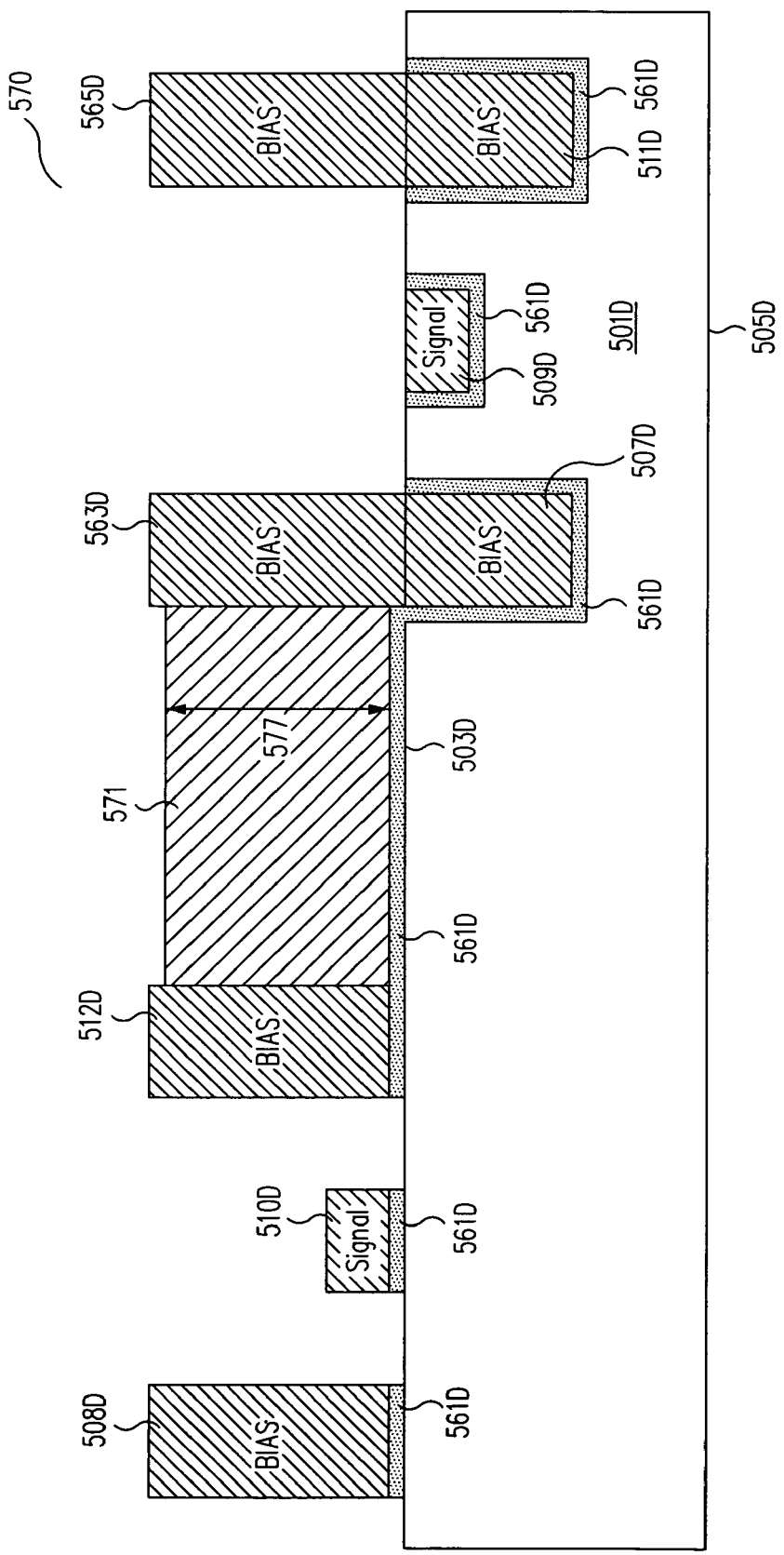
FIG. 5D shows a representation of a cutaway side view of an in-plane and out-of-plane embedded trace substrate in accordance with the principles of one embodiment.

In some instances, it is desirable to create a substrate structure wherein bias traces and signal traces are formed in and out of a given horizontal plane with one or more out-of-plane bias traces formed directly above one or more in-plane bias traces and two or more of the bias traces are electrically coupled. FIG. 5D shows a representation of a cutaway side view of an in-plane and out-of-plane embedded trace substrate 570 in accordance with the principles of one embodiment. As shown in FIG. 5D, in-plane and out-of-plane embedded trace substrate 570 includes: dielectric layer first surface 503D; dielectric layer second surface 505D, opposite dielectric layer first surface 503D; dielectric layer 501D, positioned between dielectric layer first surface 503D and dielectric layer second surface 505D; in-plane first bias trace 507D; in-plane first signal trace 509D; in-plane second bias trace 511D; out-of-plane first bias trace 508D; out-of-plane first signal trace 510D; out-of-plane second bias trace 512D; out-of-plane third bias trace 563D; out-of-plane fourth bias trace 565D; portions of seed layer 561D; and electrically conductive connector trace 571.

In one embodiment: dielectric layer first surface 503D; dielectric layer second surface 505D; dielectric layer 501D; in-plane first bias trace 507D; in-plane first signal trace 509D; in-plane second bias trace 511D; out-of-plane first bias trace 508D; out-of-plane first signal trace 510D; and out-of-plane second bias trace 512D; and portions of seed layer 561D of in-plane and out-of-plane embedded trace substrate 570 of FIG. 5D are substantially similar to: dielectric layer first surface 503; dielectric layer second surface 505; dielectric layer 501; in-plane first bias trace 507; in-plane first signal trace 509; in-plane second bias trace 511; out-of-plane first bias trace 508; out-of-plane first signal trace 510; out-of-plane second bias trace 512; and portions of seed layer 561 of in-plane and out-of-plane embedded trace substrate 500 of FIG. 5A. Consequently, the discussion above with respect to: dielectric layer first surface 503; dielectric layer second surface 505; dielectric layer 501; in-plane first bias trace 507; in-plane first signal trace 509; in-plane second bias trace 511; out-of-plane first bias trace 508; out-of-plane first signal trace 510; out-of-plane second bias trace 512; and portions of seed layer 561 of in-plane and out-of-plane embedded trace substrate 500 of FIG. 5A is applicable to, and incorporated here for, similarly named and labeled elements: dielectric layer first surface 503D; dielectric layer second surface 505D; dielectric layer 501D; in-plane first bias trace 507D; in-plane first signal trace 509D; in-plane second bias trace 511D; out-of-plane first bias trace 508D; out-of-plane first signal trace 510D; out-of-plane second bias trace 512D; and portions of seed layer 561D of in-plane and out-of-plane embedded trace substrate 570 of FIG. 5D.

In one embodiment, dielectric layer 501D is made of any of the numerous substrate materials known to those of skill in the art such as Prepreg, or any other primarily dielectric substrate material, whether known at the time of filing or developed later. In one embodiment, seed layer 561D is applied to prepare dielectric layer first surface 503D to receive a conductive layer. In one embodiment, seed layer 561D is a layer of metal, such as copper. In other embodiments, seed layer 561D can be any metal or other conductive material desired, whether known at the time of filing or as developed later. In one embodiment, in-plane first bias trace 507D, in-plane first signal trace 509D, in-plane second bias trace 511D, out-of-plane first bias trace 508D, out-of-plane first signal trace 510D; out-of-plane second bias trace 512D; out-of-plane third bias trace 563D; out-of-plane fourth bias trace 565D; and electrically conductive connector trace 571, are made of a conductive material, such as a metal.

As shown in FIG. 5D, in-plane and out-of-plane embedded trace substrate 570 includes out-of-plane third bias trace 563D and out-of-plane fourth bias trace 565D. In one embodiment, out-of-plane third bias trace 563D and out-of-plane fourth bias trace 565D are similar to out-of-plane first bias trace 508D and out-of-plane second bias trace 512D. However, in one embodiment, out-of-plane third bias trace 563D and out-of-plane fourth bias trace 565D are formed directly over in-plane first bias trace 507D and in-plane second bias trace 511D, respectively, to provide further shielding for in-plane first signal trace 509D, and, in particular, to shield out-of-plane electromagnetic field components produced by signal on in-plane first signal trace 509D. Consequently, out-of-plane third bias trace 563D and out-of-plane fourth bias trace 565D provide more complete shielding of first signal trace 509D.

In one embodiment, one or more of the physical dimensions, such as width and height, of out-of-plane third bias trace 563D and out-of-plane fourth bias trace 565D are substantially similar to the physical dimensions of in-plane first bias trace 507D and in-plane second bias trace 511D and/or out-of-plane first bias trace 508D and out-of-plane second bias trace 512D. In other embodiments, the physical dimensions, such as width and height, of out-of-plane third bias trace 563D and out-of-plane fourth bias trace 565D are different, depending on the needs and desires of the user of the invention.

As shown in FIG. 5D, in one embodiment, in-plane and out-of-plane embedded trace substrate 570 includes conductive connector trace 571. As shown in FIG. 5D, in one embodiment, conductive connector trace 571 rises a height 577 above dielectric layer first surface 503D. In some embodiments, conductive connector trace 571 is formed such that height 577 is approximately the same as the height of out-of-plane third bias trace 563D and out-of-plane fourth bias trace 565D. In other embodiments, height 577 of conductive connector trace 571 is formed to any specified value based on the desired electrical characteristics for, and/or provided by, conductive connector trace 571.

FIGS. 6A, 6B, 6C, 6D, 6E, 6F, 6G, 6H, 6I, 6J, 6K and 6L together are a representation of some of the fabrication stages making up one embodiment of a method for creating an in-plane and out-of-plane embedded trace substrate, such as in-plane and out-of-plane embedded trace substrate 500 of FIG. 5A.

Figure 6A:
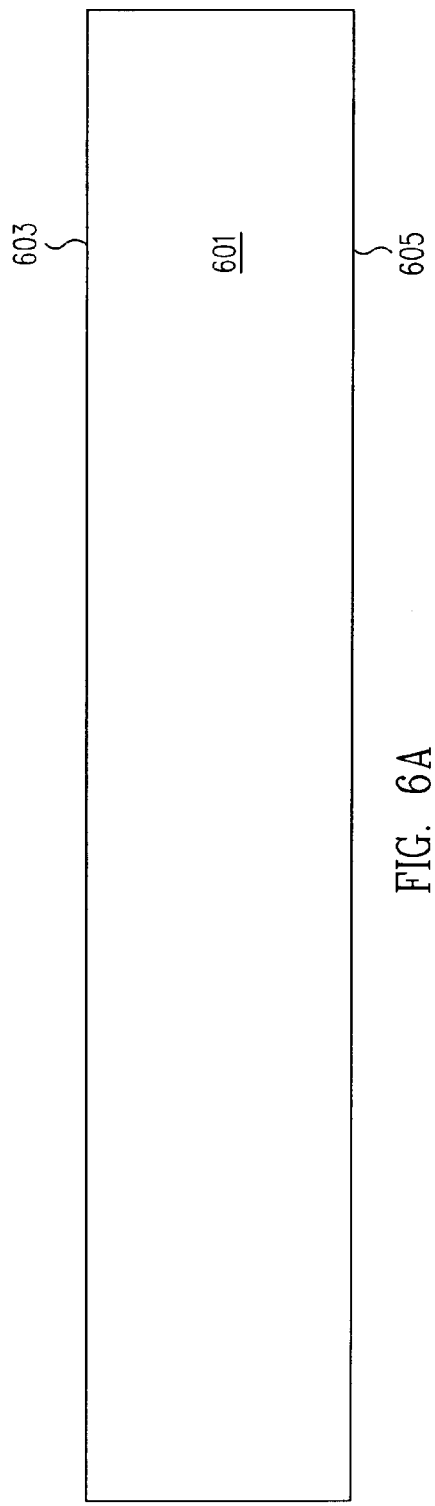
FIG. 6A shows a representation of a cutaway side view of a substrate prior to processing in accordance with the principles of one embodiment.

FIG. 6A shows a representation of a cutaway side view of a substrate prior to processing in accordance with the principles of one embodiment. As shown in FIG. 6A, and as discussed above, the substrate includes dielectric layer first surface 603 and dielectric layer second surface 605, opposite dielectric layer first surface 603, and separated from dielectric layer first surface 603 by dielectric layer 601. As discussed above, dielectric layer 601 is made of any of the numerous substrate materials known to those of skill in the art such as Prepreg, or any other primarily dielectric substrate material, whether known at the time of filing or as later developed.

Figure 6B:
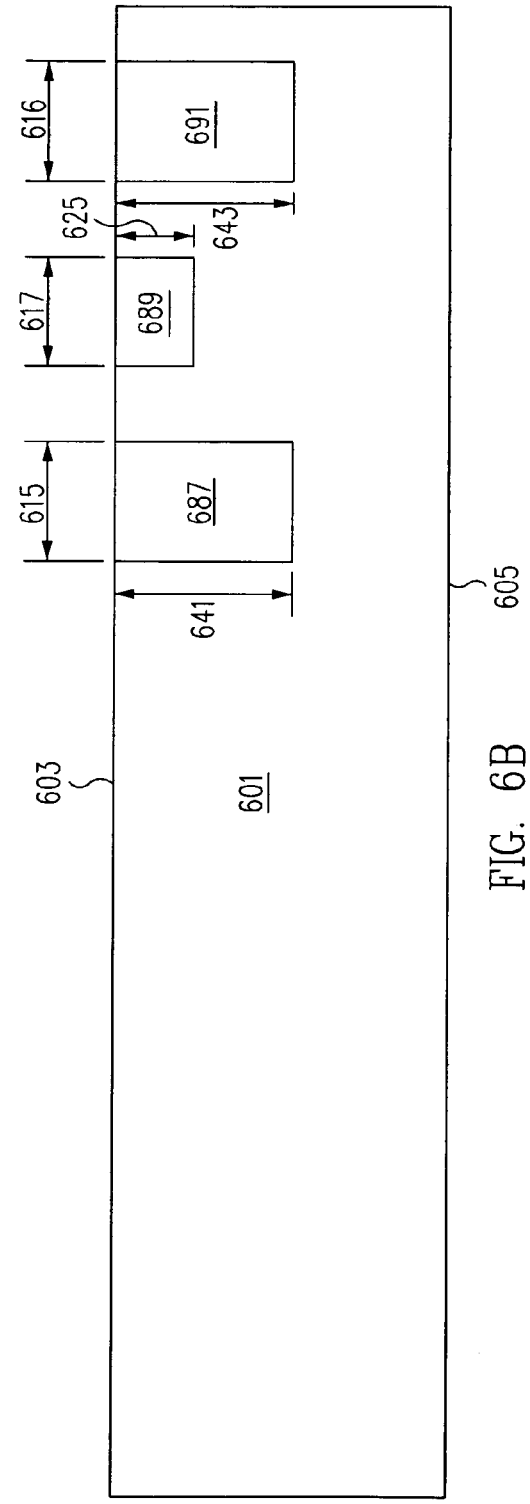
FIG. 6B shows a representation of a cutaway side view of a partially processed substrate structure in accordance with the principles of one embodiment.

FIG. 6B shows a representation of a cutaway side view of a partially processed substrate structure after an in-plane first bias trace trench 687, an in-plane first signal trace trench 689, and an in-plane second bias trace trench 691 have been formed into dielectric layer 601 in accordance with the principles of one embodiment.

Returning to FIG. 6B, in one embodiment, in-plane first bias trace trench 687 is formed with an in-plane first bias trace trench depth 641 into dielectric layer 601 and with an in-plane first bias trace trench horizontal width 615 at dielectric layer first surface 603. In one embodiment, in-plane first bias trace trench 687 is created using LASER ablation or any other method for ablating, etching, scratching, digging, or otherwise forming a trench into a substrate, whether known at the time of filing or as developed later.

As also shown in FIG. 6B, in one embodiment, in-plane second bias trace trench 691 is formed with an in-plane second bias trace trench depth 643 into dielectric layer 601 and with an in-plane second bias trace trench horizontal width 616 at dielectric layer first surface 603. In one embodiment, in-plane second bias trace trench 691 is created using LASER ablation or any other method for ablating, etching, scratching, digging, or otherwise forming a trench into a substrate, whether known at the time of filing or as developed later.

As also shown in FIG. 6B, in one embodiment, in-plane first signal trace trench 689 is formed with an in-plane first signal trace trench depth 625 into dielectric layer 601 and with an in-plane first signal trace trench horizontal width 617 at dielectric layer first surface 603. In one embodiment, in-plane first signal trace trench 689 is created using LASER ablation or any other method for ablating, etching, scratching, digging, or otherwise forming a trench into a substrate, whether known at the time of filing or as developed later.

Figure 6C:
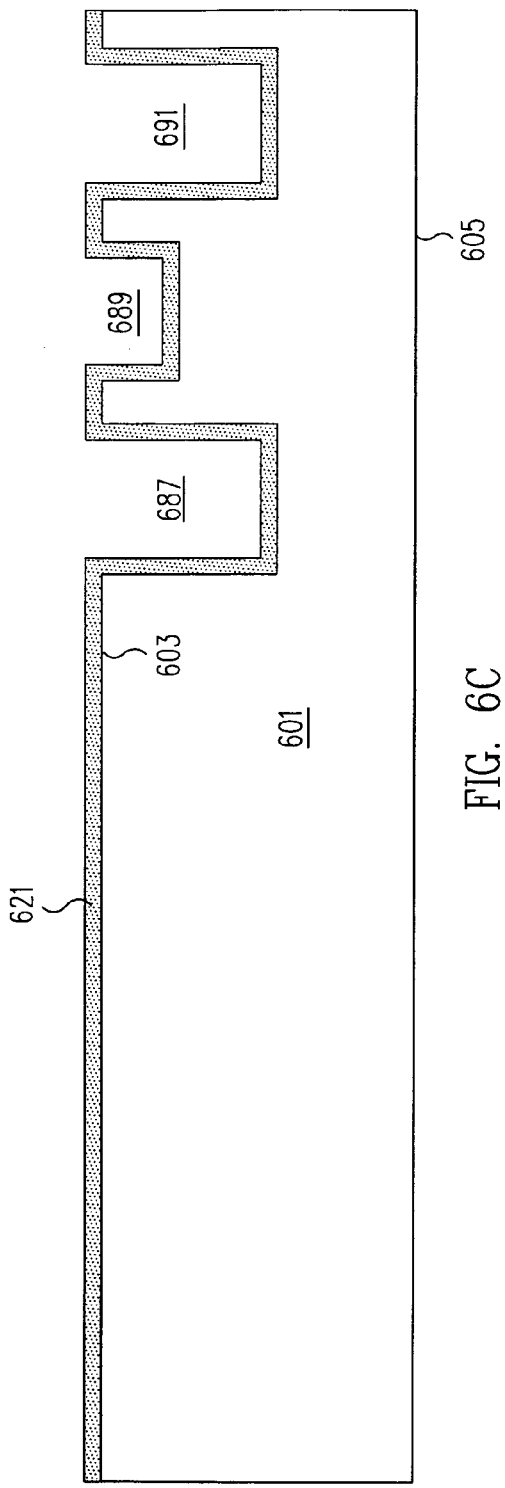
FIG. 6C shows a representation of a cutaway side view of a partially processed substrate structure in accordance with the principles of one embodiment.

FIG. 6C shows a representation of a cutaway side view of a partially processed substrate structure after a seed layer 621 has been applied to dielectric layer first surface 603 of the substrate structure of FIG. 6B, including the surfaces of in-plane first bias trace trench 687, in-plane first signal trench 689, and in-plane second bias trace trench 691 in accordance with the principles of one embodiment.

Returning to FIG. 6C, seed layer 621 is applied to prepare dielectric layer first surface 603 to receive a conductive layer. In one embodiment, seed layer 621 is a layer of metal, such as copper. In other embodiments, seed layer 621 can be any metal or other conductive material desired, whether known at the time of filing or as developed later. Methods, apparatuses, and structures associated with applying a seed layer, such as seed layer 621, to a substrate are well known to those of skill in the art. Consequently, a more detailed discussion of the application of seed layers to a substrate is omitted here to avoid detracting from the invention.

Figure 6D:
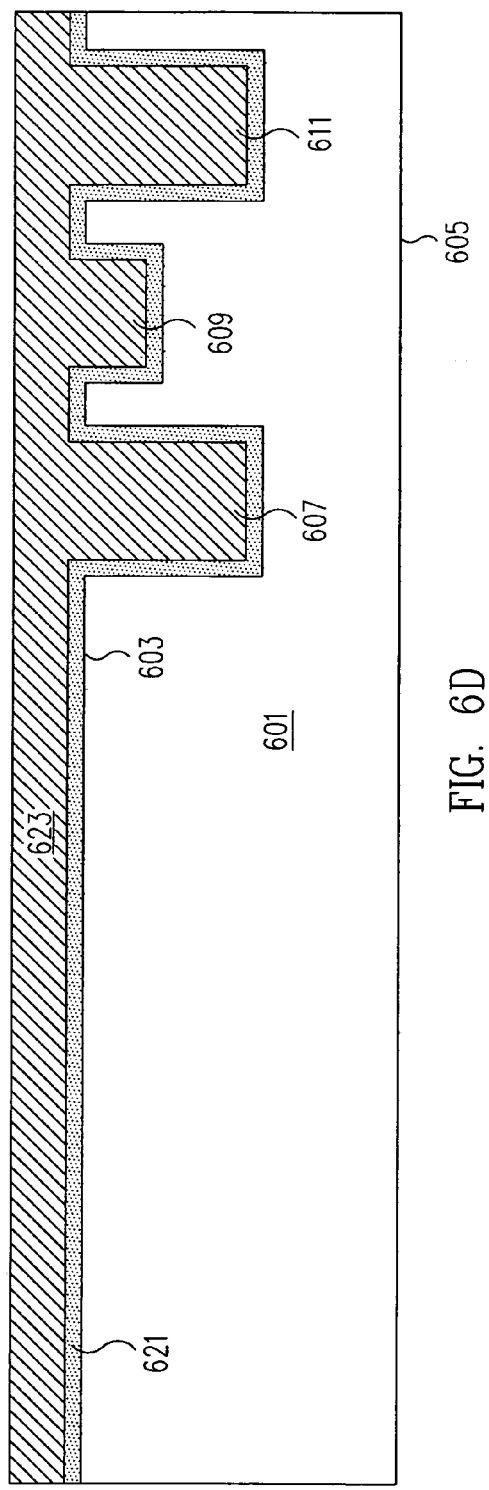
FIG. 6D shows a representation of a cutaway side view of a partially processed substrate structure in accordance with the principles of one embodiment.

FIG. 6D shows a representation of a cutaway side view of a partially processed substrate structure after a layer of conductive material 623 has been applied to dielectric layer first surface 603 and seed layer 621 (FIG. 6C) of substrate structure of FIG. 6C, and filled in-plane first bias trace trench 687 (FIG. 6C), in-plane first signal trench 689 (FIG. 6C), and in-plane second bias trace trench 691 (FIG. 6C) thereby forming an in-plane first bias trace 607 (FIG. 6D), an in-plane first signal trace 609 (FIG. 6D), and an in-plane second bias trace 611 (FIG. 6D) in accordance with the principles of one embodiment.

In one embodiment, layer of conductive material 623 is a layer of metal, such as copper. In other embodiments, layer of conductive material 623 can be any metal or other conductive material desired, whether known at the time of filing or as developed later. Methods, apparatuses, and structures associated with applying a layer of conductive material, such as layer of conductive material 623, to a substrate, are well known to those of skill in the art. Consequently, a more detailed discussion of the application of layers of conductive material to a substrate is omitted here to avoid detracting from the invention.

Figure 6E:
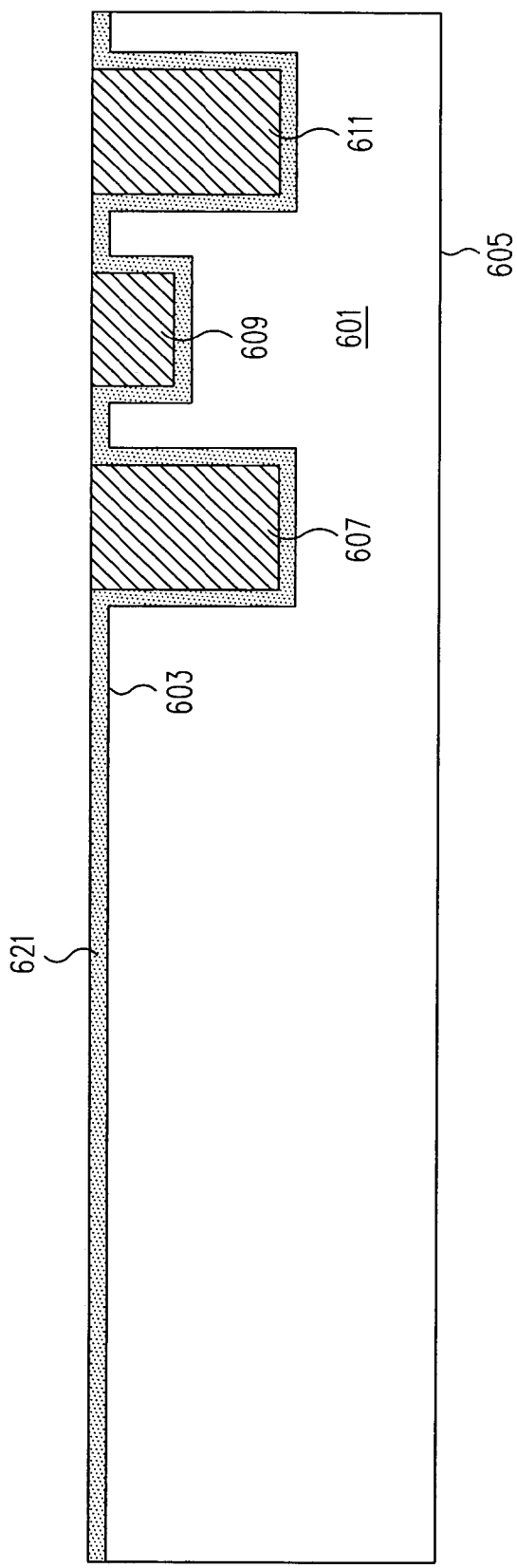
FIG. 6E shows a representation of a cutaway side view of a partially processed substrate structure in accordance with the principles of one embodiment.

FIG. 6E shows a representation of a cutaway side view of a partially processed substrate structure after excess conductive material has been removed from layer of conductive material 623 of FIG. 6D to yield in-plane first bias trace 607, in-plane first signal trace 609, and in-plane second bias trace 611 in accordance with the principles of one embodiment. In one embodiment, the excess conductive material of layer of conductive material 623 of FIG. 6D is removed using any process for removing conductive material, such as grinding, etching, scraping or any other mechanical or chemical process, whether known at the time of filing or as developed thereafter.

Figure 6F:
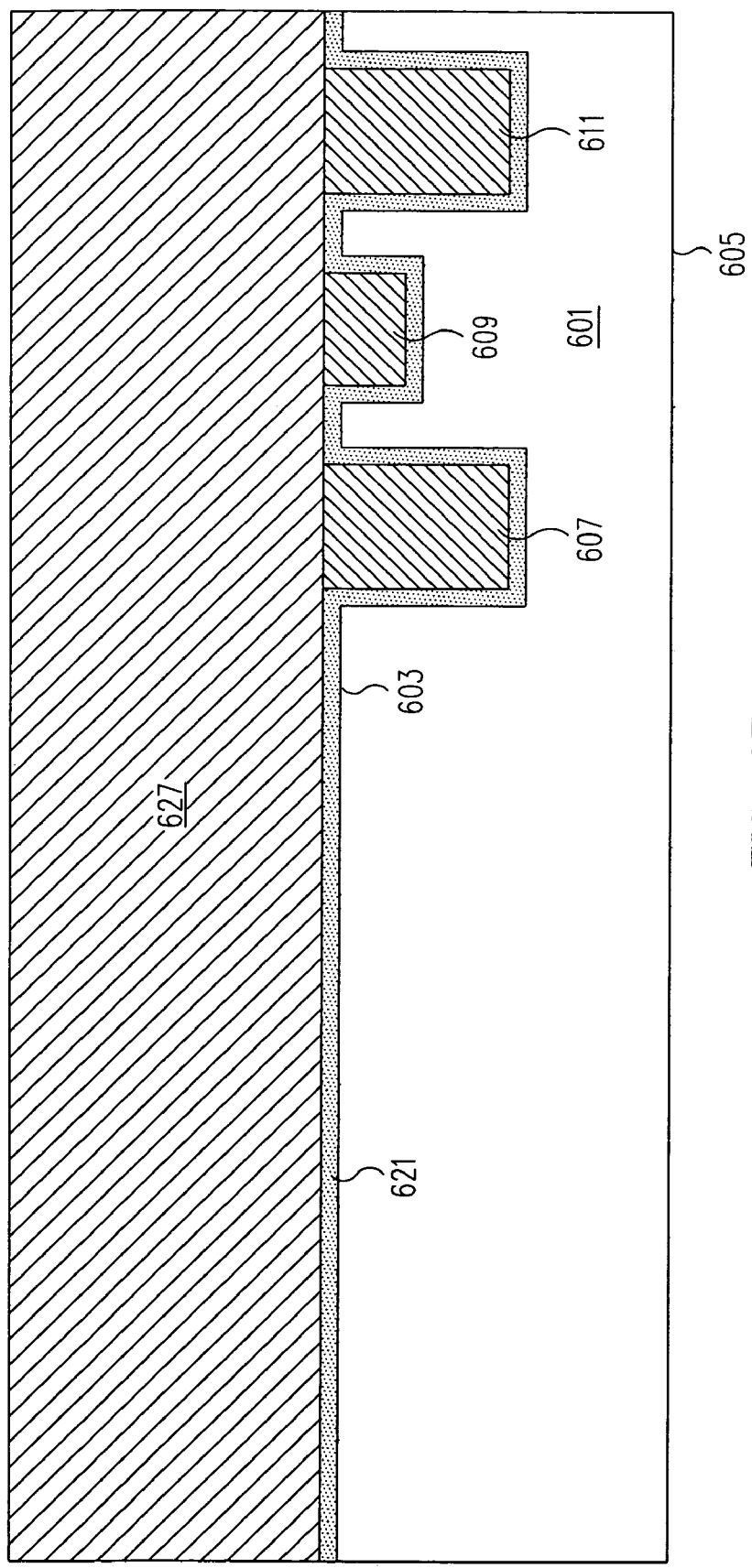
FIG. 6F shows a representation of a cutaway side view of a partially processed substrate structure in accordance with one embodiment.

FIG. 6F shows a representation of a cutaway side view of a partially processed substrate structure after a layer of photo resist 627 has been applied to seed layer 621 in accordance with one embodiment. In one embodiment, layer of photo resist 627 is attached to seed layer 621 using one of various methods known to those of skill in the art such as adhesives, tapes, and static surface placement, whether known at the time of filing or as developed thereafter. In one embodiment, layer of photo resist 627 is any photo resist material and/or masking material capable of being selectively etched and/or ablated and or chemically removed. Methods, apparatuses, and structures associated with applying a layer of photo resist, such as layer of photo resist 627, are well known to those of skill in the art. Consequently, a more detailed discussion of the application of layers of photo resist is omitted here to avoid detracting from the invention.

Figure 6G:
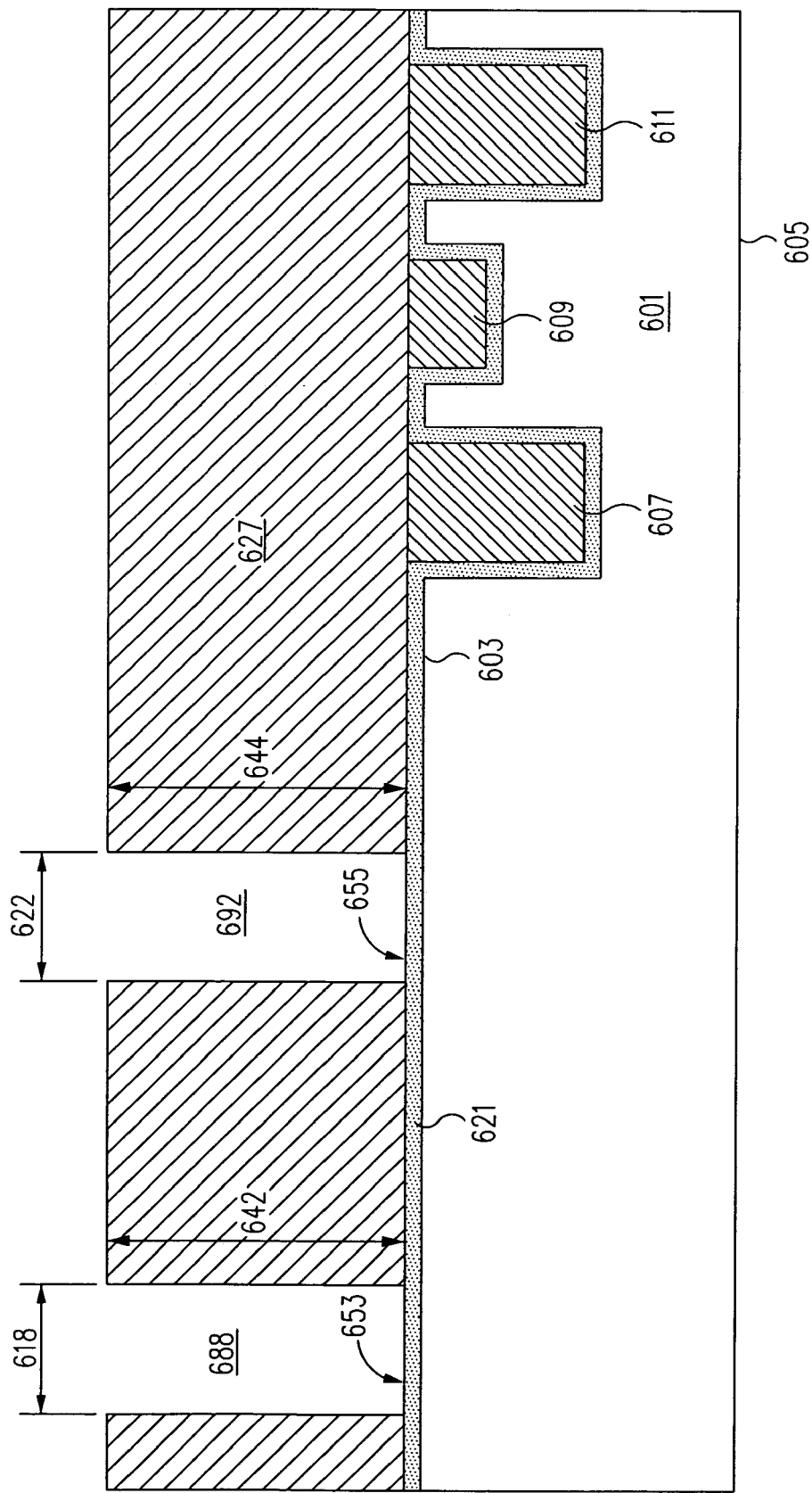
FIG. 6G shows a representation of a cutaway side view of a partially processed substrate structure in accordance with one embodiment.

FIG. 6G shows a representation of a cutaway side view of a partially processed substrate structure after an out-of-plane first bias trace trench 688 has been formed in photo resist layer 627 in accordance with one embodiment. As shown in FIG. 6G, out-of-plane first bias trace trench 688 is formed in photo resist layer first surface 651 to a first bias trace trench depth 642 such that a portion of seed layer 621 forms a bottom surface 653 of out-of-plane first bias trace trench 688. As also shown in FIG. 6G, out-of-plane first bias trace trench 688 includes horizontal width 618 at photo resist layer first surface 651. In one embodiment, out-of-plane first bias trace trench 688 is created as a pattern resist using methods well known to those of skill in the art. In one embodiment, out-of-plane first bias trace trench 688 is created using LASER ablation or any other method for ablating, etching, scratching, digging, or otherwise forming a trench into a photo resist layer, whether known at the time of filing or as developed later.

As shown in FIG. 6G, out-of-plane second bias trace trench 692 is also formed in photo resist layer first surface 651 to an out-of-plane second bias trace trench depth 644 such that a portion of seed layer 621 forms a bottom surface 655 of out-of-plane second bias trace trench 692. As also shown in FIG. 6G, out-of-plane second bias trace trench 692 includes horizontal width 622 at photo resist layer first surface 651. In one embodiment, out-of-plane second bias trace trench 692 is created as a pattern resist using methods well known to those of skill in the art. In one embodiment, out-of-plane first bias trace trench 692 is created using LASER ablation or any other method for ablating, etching, scratching, digging, or otherwise forming a trench into a photo resist layer, whether known at the time of filing or as developed later.

Figure 6H:
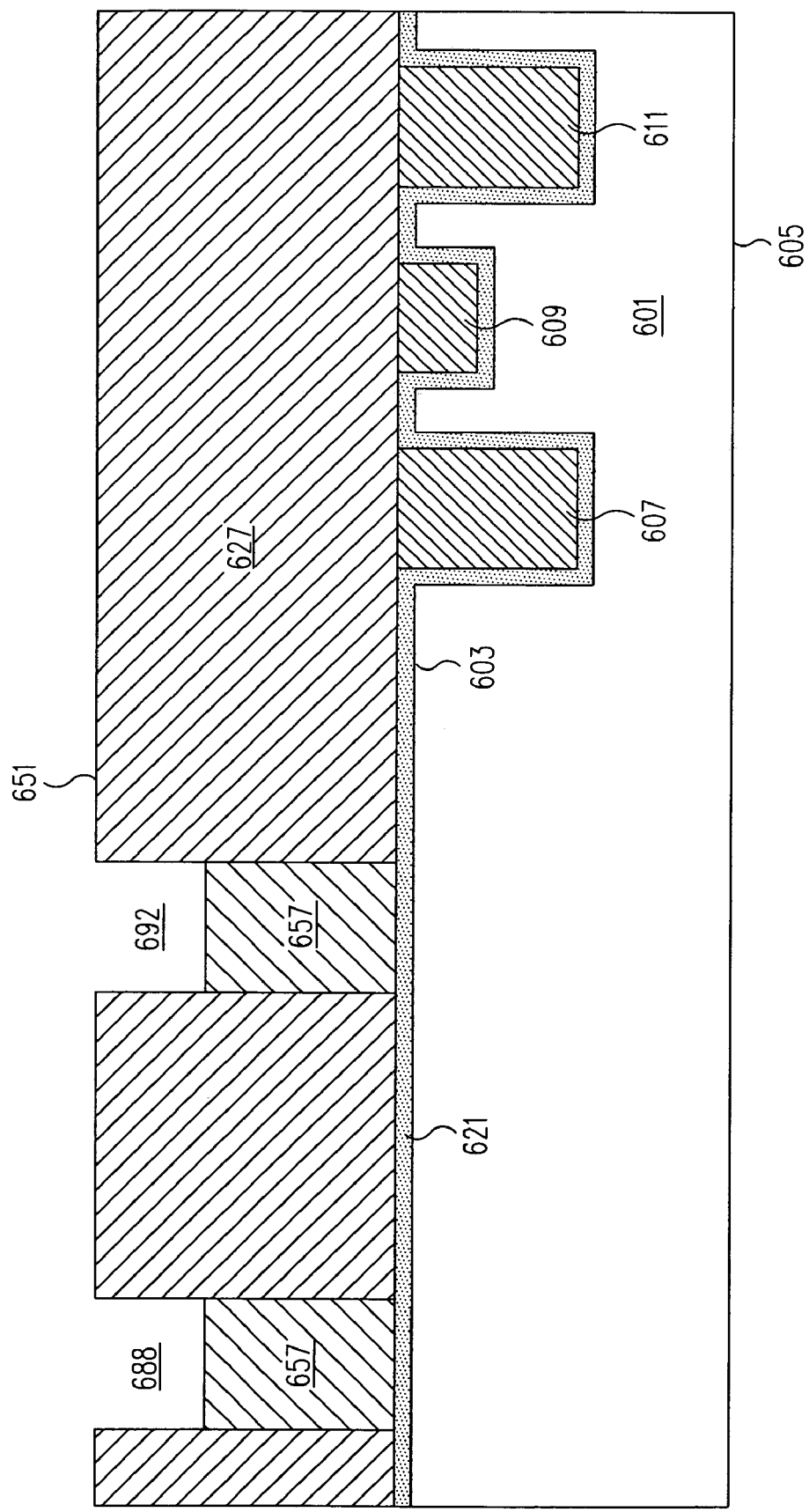
FIG. 6H shows a representation of a cutaway side view of a partially processed substrate structure in accordance with one embodiment.

FIG. 6H shows a representation of a cutaway side view of a partially processed substrate structure after a conductive material 657 has been plated into out-of-plane first bias trace trench 688 and out-of-plane second bias trace trench 692 of FIG. 6G, partially filling out-of plane first bias trace trench 688 and out-of-plane second bias trace trench 692 in accordance with one embodiment. In one embodiment, conductive material 657 is copper or any other metal or conductive material, whether known at the time of filing or as developed later. In one embodiment, conductive material 657 is the same conductive material making up seed layer 621. Methods, apparatuses, and structures associated with conductive material plating are well known to those of skill in the art. Consequently, a more detailed discussion of conductive material plating is omitted here to avoid detracting from the invention.

Figure 6I:
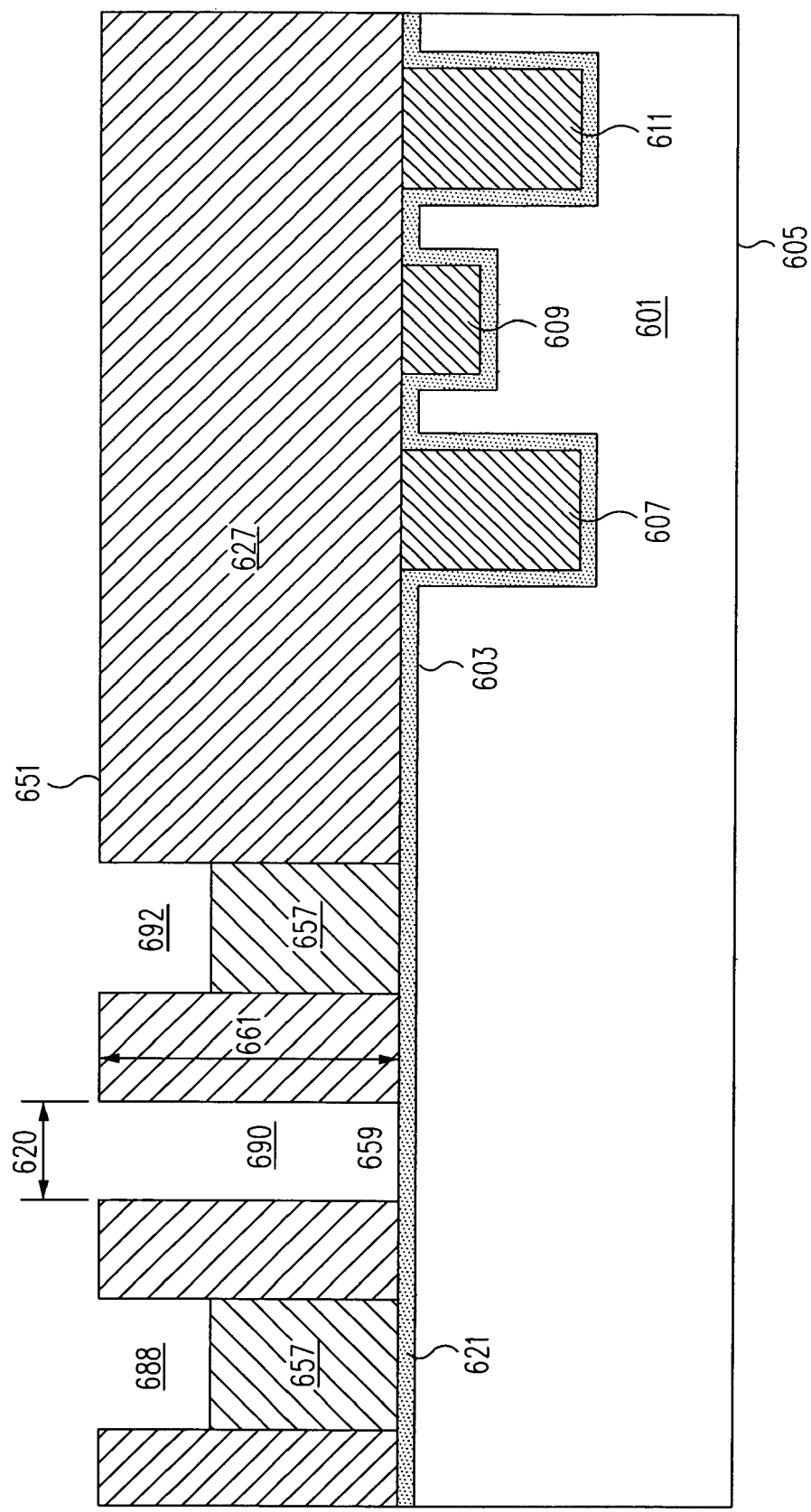
FIG. 6I shows a representation of a cutaway side view of a partially processed substrate structure in accordance with one embodiment.

FIG. 6I shows a representation of a cutaway side view of a partially processed substrate structure after an out-of-plane first signal trace trench 690 has been formed in photo resist layer 627 in accordance with one embodiment. As shown in FIG. 6I, out-of-plane first signal trace trench 690 is formed in photo resist layer first surface 651 to a depth 661 such that a portion of seed layer 621 forms a second, or bottom, surface 659 of out-of-plane first signal trace trench 690. As also shown in FIG. 6I, out-of-plane first signal trace trench 690 includes horizontal width 620 at photo resist layer first surface 651. In one embodiment, out-of-plane first signal trace trench 690 is created as a pattern resist using methods well known to those of skill in the art. In one embodiment, out-of-plane first signal trace trench 690 is created using LASER ablation or any other method for ablating, etching, scratching, digging, or otherwise forming a trench into a photo resist layer, whether known at the time of filing or as developed later.

Figure 6J:
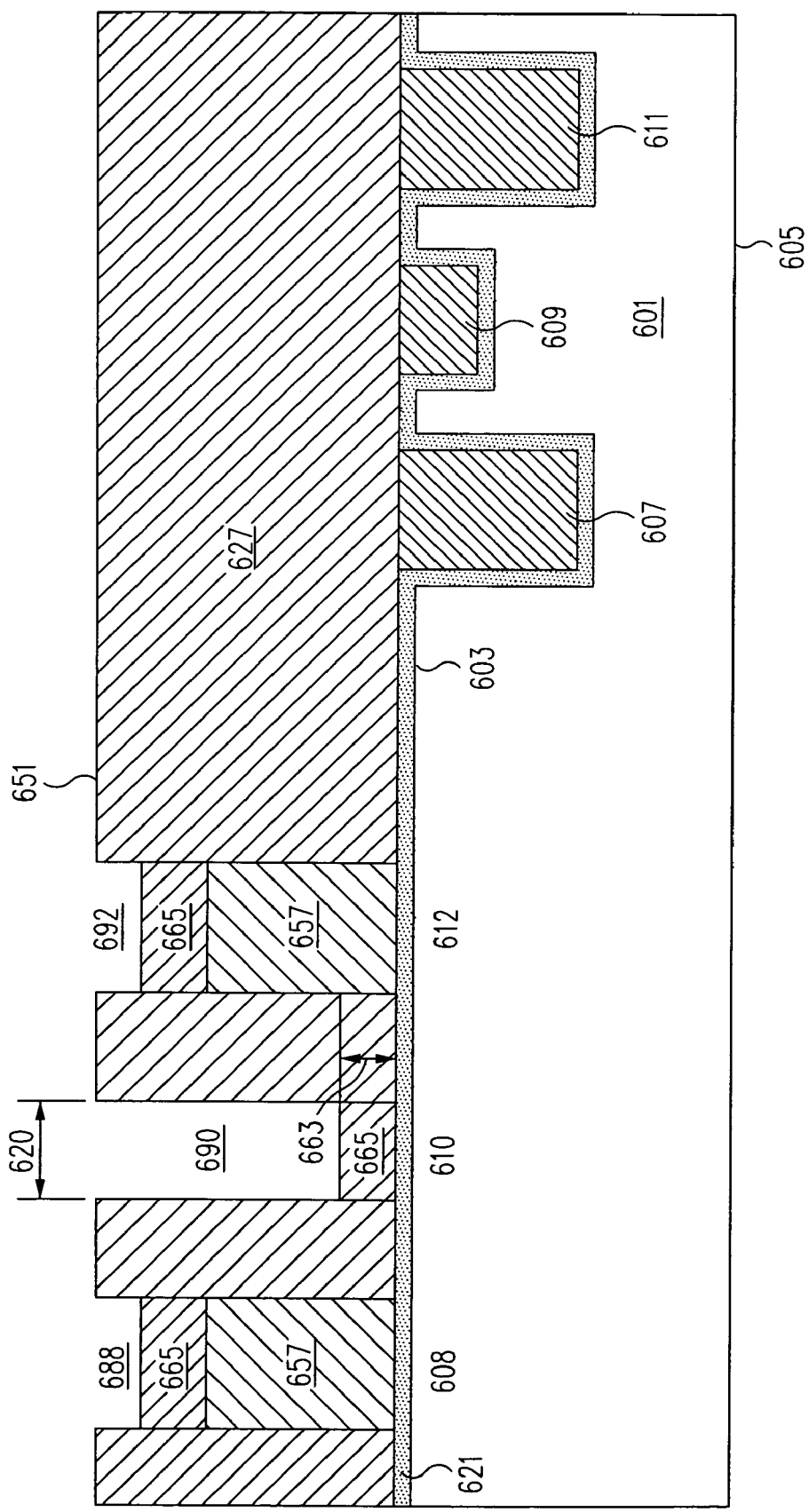
FIG. 6J shows a representation of a cutaway side view of a partially processed substrate structure in accordance with the principles of one embodiment.

FIG. 6J shows a representation of a cutaway side view of a partially processed substrate structure after a layer of conductive material 665 of height 663 has been plated into out-of-plane first bias trace trench 688 (FIG. 6I), out-of-plane first signal trace trench 690 (FIG. 6I), and out-of-plane second bias trace trench 692 (FIG. 6I) to form an out-of-plane first bias trace 608 (FIG. 6J), an out-of-plane first signal trace 610 (FIG. 6J), and an out-of-plane second bias trace 612 (FIG. 6J) in accordance with the principles of one embodiment. In one embodiment, conductive material 665 is copper or any other metal or conductive material, whether known at the time of filing or is developed later. In one embodiment conductive material 665 is the same conductive material making up seed layer 621 and conductive material 657 of FIG. 6I. Methods, apparatuses, and structures associated with conductive material plating are well known to those of skill in the art. Consequently, a more detailed discussion of conductive material plating is omitted here to avoid detracting from the invention.

Figure 6K:
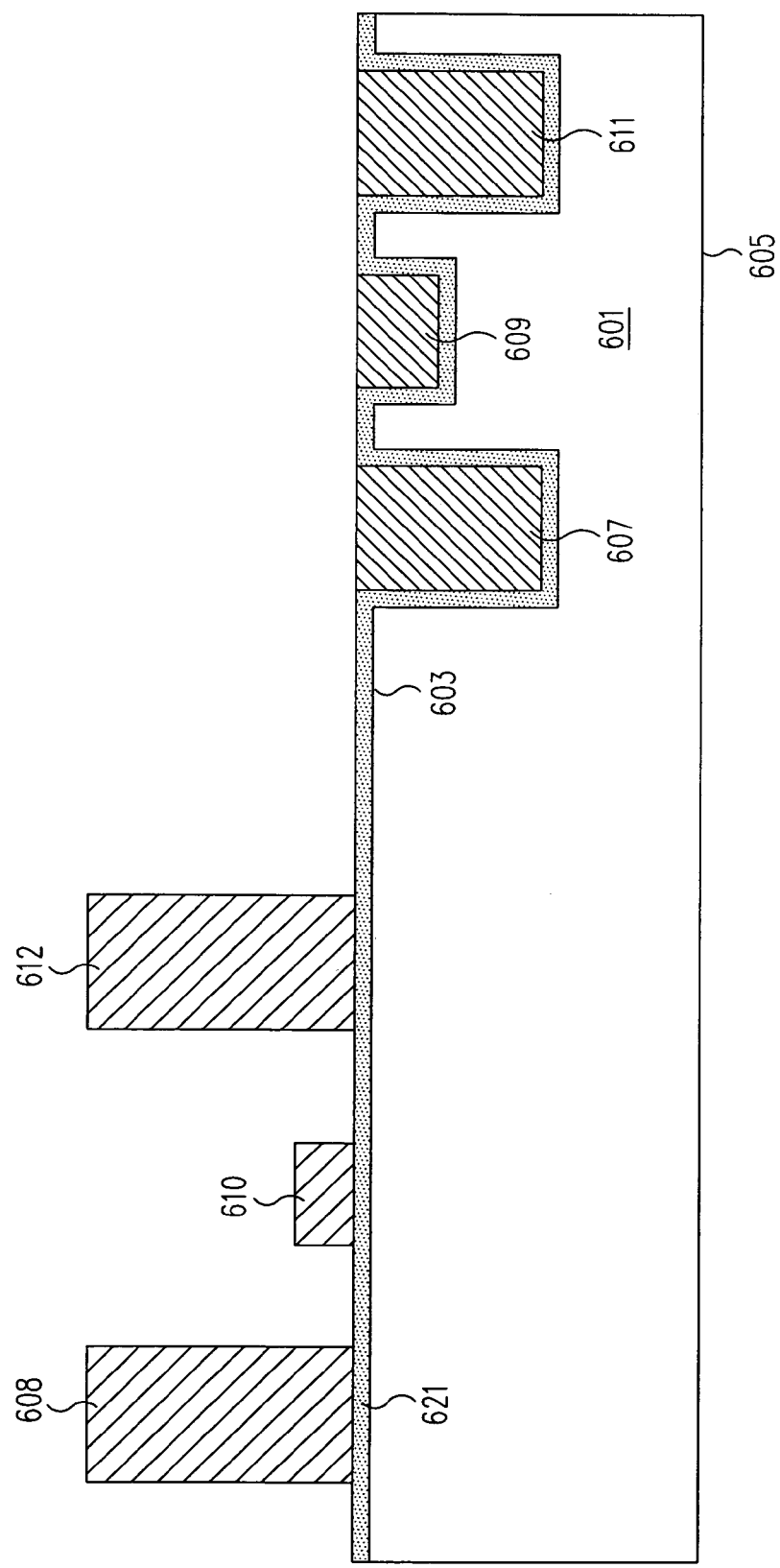
FIG. 6K shows a representation of a cutaway side view of a partially processed substrate structure in accordance with one embodiment.

FIG. 6K shows a representation of a cutaway side view of a partially processed substrate structure after photo resist layer 627 of FIG. 6J has been removed in accordance with one embodiment by methods well know to those of skill in the art such as chemical and/or electro-magnetic energy etching, or any other methods and/or processes for removing photo resist material, whether known at the time of filing or developed thereafter.

Figure 6L:
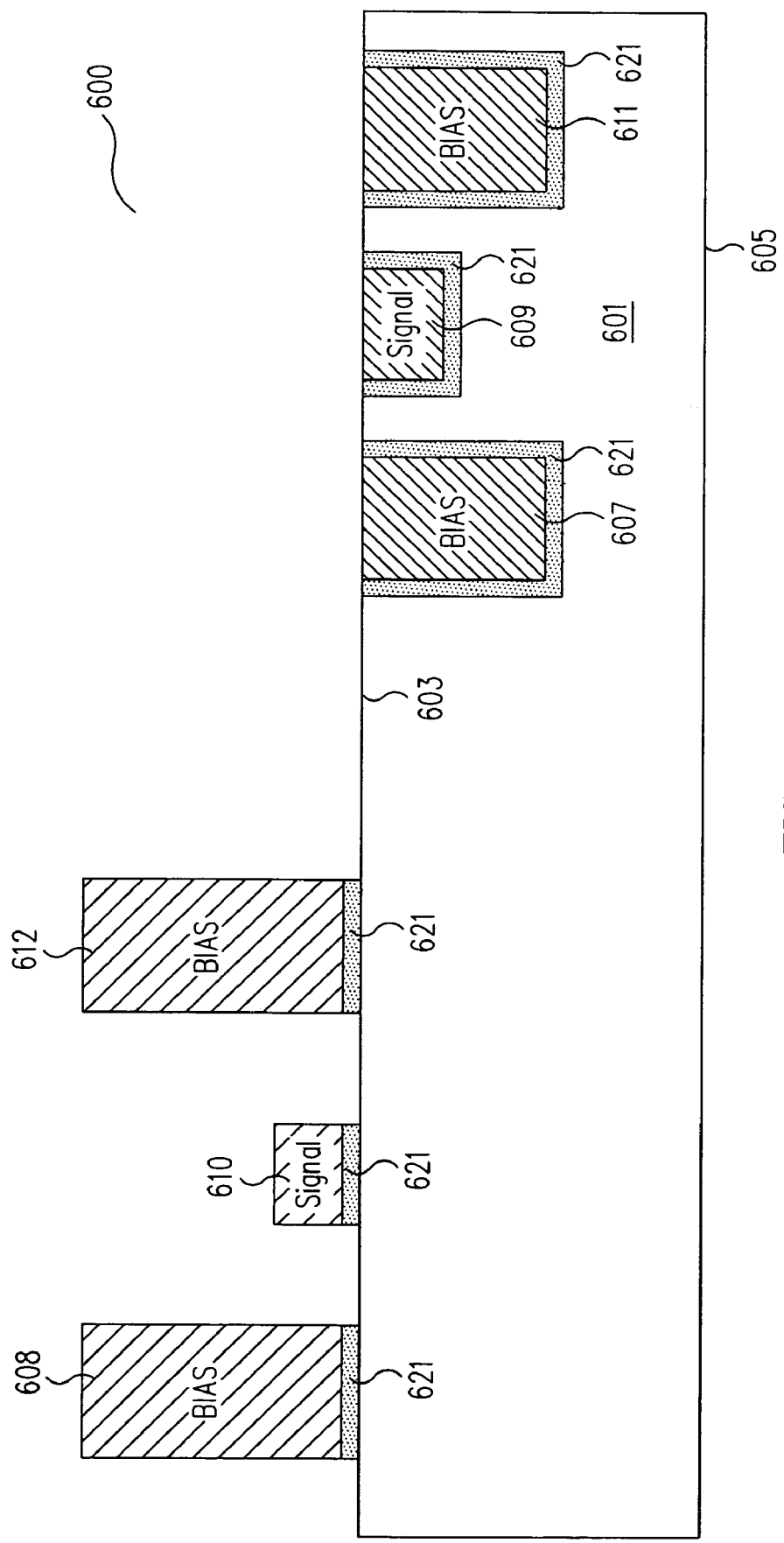
FIG. 6L shows a representation of a cutaway side view of the structure of FIG. 6J after excess conductive material has been removed to yield an in-plane and out-of-plane embedded trace substrate in accordance with the principles of one embodiment.

FIG. 6L shows a representation of a cutaway side view of the structure of FIG. 6J after excess conductive material has been removed to yield an in-plane and out-of-plane embedded trace substrate in accordance with the principles of one embodiment.

In other embodiments, the process discussed above with respect to FIGS. 6A to 6L is continued and repeated as a second dielectric layer is applied to the first dielectric layer first surface, such as dielectric layer first surface 603, and then in-plane bias and signal traces, such as traces 607, 609 and 611 are then embedded in the second dielectric layer, by a process such as described above, and electrical connections are made between the first dielectric layer and the second dielectric layer using methods well known to those of skill in the art, such as blind vias or through hole vias, between the two dielectric layers. In other embodiments, out-of-plane bias and signal traces, such as traces 608, 610 and 612, are then formed on the second dielectric layer, by a process such as described above. This layering of dielectric layers can be continued through as many iterations as needed to create a multilayer structure to accommodate almost any signal density desired.

In some embodiments, it is desirable to shape the embedded bias and/or signal traces. Since, according to one embodiment of the invention, LASER ablation is used to form the traces, there is sufficient control and accuracy to form virtually any shaped trace desired. In some instances, shaping bias and/or signal traces can help deliver optimal electrical performance and significantly reduce noise.

Figure 7:
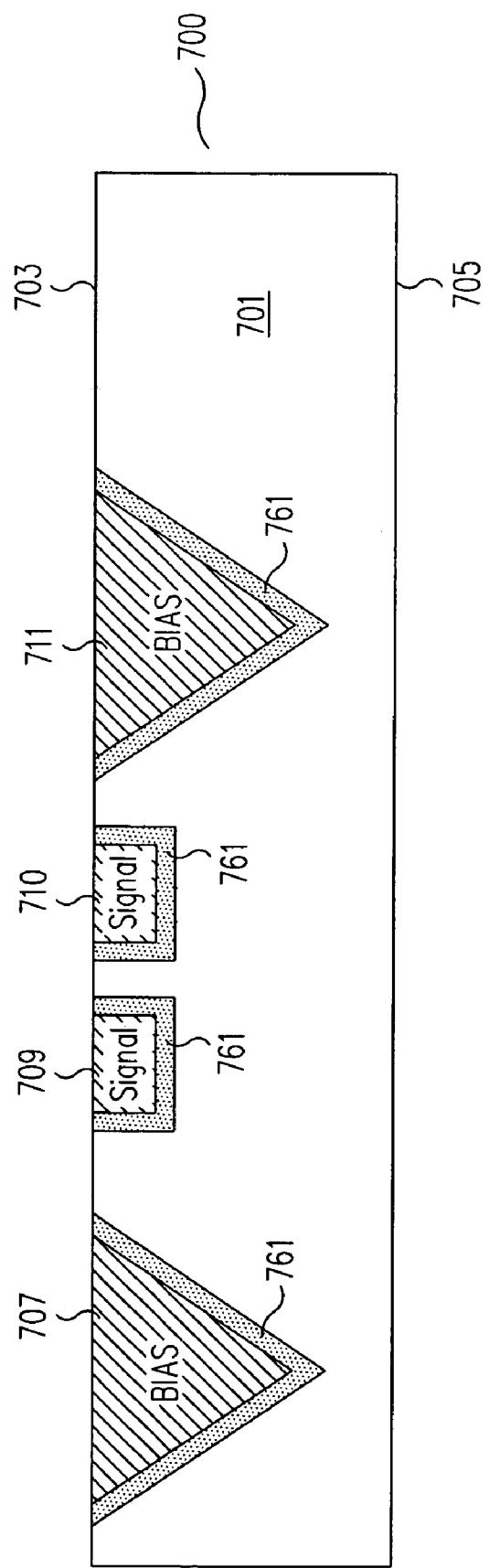
FIG. 7 shows a representation of a cutaway side view of an embedded trace substrate in accordance with the principles of one embodiment.

FIG. 7 shows a representation of a cutaway side view of an embedded trace substrate 700 in accordance with the principles of one embodiment. As shown in FIG. 7, embedded trace substrate 700 includes: dielectric layer first surface 703; dielectric layer second surface 705, opposite dielectric layer first surface 703; dielectric layer 701, positioned between dielectric layer first surface 703 and dielectric layer second surface 705; first triangular bias trace 707; second triangular bias trace 711; first signal trace 709; second signal trace 710; and portions of seed layer 761.

As seen in FIG. 7, first triangular bias trace 707 and second triangular bias trace 711 are, as their names implies, substantially triangular in shape and are embedded in dielectric layer 701, in one embodiment, by LASER ablation techniques.

Figure 8:
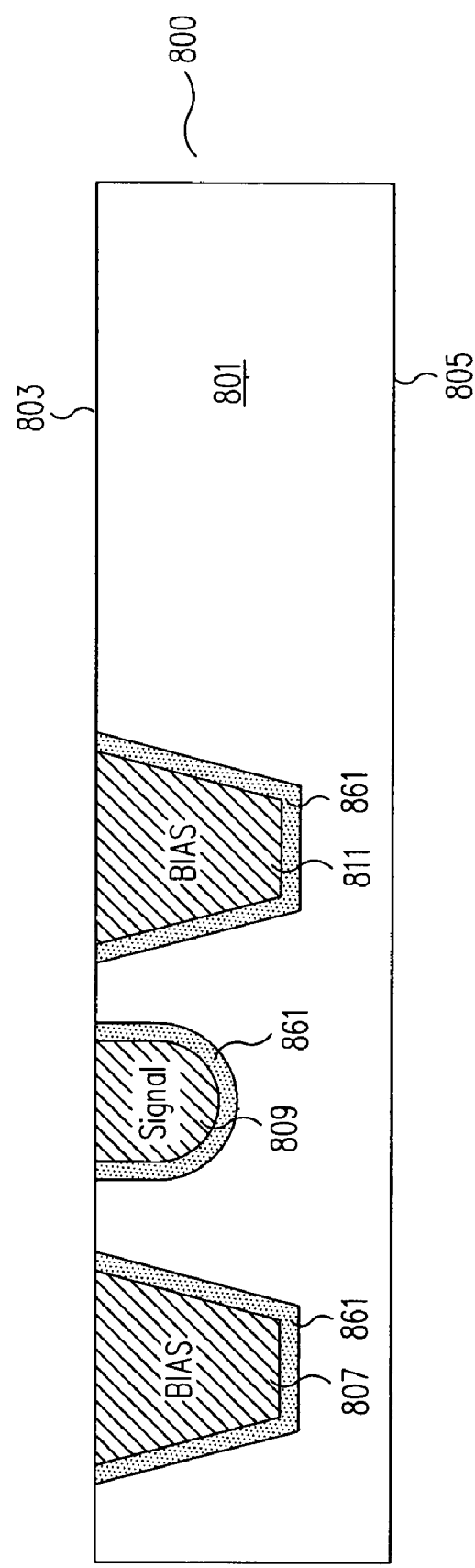
FIG. 8 shows a representation of a cutaway side view of an embedded trace substrate in accordance with the principles of one embodiment.

In other embodiments, both the bias traces and the signal traces are shaped traces. FIG. 8 shows a representation of a cutaway side view of an embedded trace substrate 800 in accordance with the principles of one embodiment. As shown in FIG. 8, embedded trace substrate 800 includes: dielectric layer first surface 803; dielectric layer second surface 805, opposite dielectric layer first surface 803; dielectric layer 801, positioned between dielectric layer first surface 803 and dielectric layer second surface 805; first trapezoidal bias trace 807; second trapezoidal bias trace 811; first rounded signal trace 809; and portions of seed layer 861.

As seen in FIG. 8, first trapezoidal bias trace 807 and second trapezoidal bias trace 811 are, as their names implies, substantially trapezoidal in shape and embedded in dielectric layer 801, in one embodiment, by LASER ablation techniques. In addition, first rounded signal trace 809 is also embedded in dielectric layer 801 and has a rounded lower surface.

Using LASER ablation, or other ablation techniques, virtually any shaped traces can be formed. Consequently, the specific shapes shown are for illustrative purposes only and other traces could be other shapes such as, but not limited to: square; rectangular; triangular; trapezoidal; hexagonal; semicircular; rounded; pointed; or any other shape desired This disclosure provides exemplary embodiments of the present invention. The scope of the present invention is not limited by these exemplary embodiments. Consequently, numerous variations, whether explicitly provided for by the specification or implied by the specification or not, may be implemented by one of skill in the art in view of this disclosure.

What is claimed is:

1. An embedded trace substrate comprising:
   a dielectric layer;
   at least one bias trace comprising a first bias trace and a second bias trace, the at least one bias trace being embedded in the dielectric layer such that the at least one bias trace extends an at least one bias trace depth into the dielectric layer;
   at least one signal trace horizontally positioned along a dielectric layer first surface between the first bias trace and the second bias trace, the at least one signal trace being embedded in the dielectric layer such that the at least one signal trace extends an at least one signal trace depth into the dielectric layer, wherein the at least one bias trace depth is greater than the at least one signal trace depth; and
   wherein: the at least one signal trace comprises a first signal trace and a second signal trace, further wherein; the first signal trace and the second signal trace are horizontally positioned along the dielectric layer first surface between the first bias trace and the second bias trace.

2. The embedded trace substrate of claim 1, wherein; the at least one bias trace depth is different from the at least one signal trace depth.

3. The embedded trace substrate of claim 2, wherein; the at least one bias trace depth and at least one signal trace depth are chosen to provide desired electrical properties.

4. The embedded trace substrate of claim 1, wherein; the at least one bias trace is shaped to optimize electrical performance.

5. The embedded trace substrate of claim 1, wherein; the at least one signal trace is shaped to optimize electrical performance.

6. The embedded trace substrate of claim 1, wherein: the at least one signal trace is horizontally positioned along the dielectric layer first surface a first horizontal distance from the first bias trace; further wherein,
   the second bias trace is horizontally positioned along the dielectric layer first surface a second horizontal distance from the at least one signal trace; further wherein,
   the first horizontal distance and the second horizontal distance are chosen to provide desired electrical properties.

7. The embedded trace substrate of claim 1, wherein:
   the first signal trace is horizontally positioned along the dielectric layer first surface a first horizontal distance from the first bias trace; further wherein,
   the second signal trace is horizontally positioned along the dielectric layer first surface a second horizontal distance from the first signal trace; further wherein,
   the second bias trace is horizontally positioned along the dielectric layer first surface a third horizontal distance from the second signal trace; further wherein,
   the first horizontal distance, the second horizontal distance, and the third horizontal distance are chosen to provide desired electrical properties.

8. An embedded trace substrate comprising:
   a first dielectric layer;
   at least one in-plane bias trace, the at least one in-plane bias trace being embedded in the first dielectric layer such that the at least one in-plane bias trace extends an at least one in-plane bias trace depth into the first dielectric layer;
   at least one in-plane signal trace, the at least one in-plane signal trace being embedded in the first dielectric layer such that the at least one in-plane signal trace extends an at least one in-plane signal trace depth into the first dielectric layer;
   an at least one out-of-plane bias trace comprising a first out-of-plane bias trace and a second out-of-plane bias trace, the at least one out-of-plane bias trace being positioned on a portion of a first dielectric layer first surface, the at least one out-of-plane bias trace extending an at least one out-of-plane bias trace height above the first dielectric layer first surface; and
   an at least one out-of-plane signal trace horizontally positioned along the first dielectric layer first surface between the first out-of-plane bias trace and the second out-of-plane bias trace, the at least one out-of-plane signal trace being positioned on a portion of the first dielectric layer first surface, the at least one out-of-plane signal trace extending an at least one out-of-plane signal trace height above the first dielectric layer first surface, wherein the at least one out-of-plane bias trace height is greater than the at least one out-of-plane signal trace height.

9. The embedded trace substrate of claim 8, wherein; the at least one in-plane bias trace depth is different from the at least one in-plane signal trace depth.

10. The embedded trace substrate of claim 8, wherein; the at least one out-of-plane bias trace height is different from the at least one out-of-plane signal trace height.

11. The embedded trace substrate of claim 8, wherein: the at least one in-plane bias trace comprises a first in-plane bias trace and a second in-plane bias trace, further wherein;

the first in-plane bias trace is embedded in the first dielectric layer such that the first in-plane bias trace extends a first in-plane bias trace depth into the first dielectric layer; further wherein, the second in-plane bias trace is embedded in the first dielectric layer such that the second in-plane bias trace extends a second in-plane bias trace depth into the first dielectric layer; further wherein, the at least one in-plane signal trace is horizontally positioned along the first dielectric layer first surface between the first in-plane bias trace and the second in-plane bias trace; further wherein, the at least one in-plane signal trace is horizontally positioned along the first dielectric layer first surface a first horizontal distance from the first in-plane bias trace; further wherein, the second in-plane bias trace is horizontally positioned along the first dielectric layer first surface a second horizontal distance from the at least one in-plane signal trace; further wherein, the at least one out-of-plane signal trace is horizontally positioned along the first dielectric layer first surface a third horizontal distance from the first out-of-plane bias trace; further wherein, the second out-of-plane bias trace is horizontally positioned along the first dielectric layer first surface a fourth horizontal distance from the at least one out-of-plane signal trace; further wherein, the first horizontal distance, the second horizontal distance, the third horizontal distance, and the fourth horizontal distance are chosen to provide desired electrical properties.

12. The embedded trace substrate of claim 8, wherein;
the at least one out-of-plane bias trace height and the at least one out-of-plane signal trace height are chosen to provide desired electrical properties.

13. The embedded trace substrate of claim 8, wherein;
the at least one out-of-plane bias trace is shaped to optimize electrical performance.

14. The embedded trace substrate of claim 8, wherein;
the at least one out-of-plane signal trace is shaped to optimize electrical performance.

15. An embedded trace substrate comprising:
a dielectric layer;
a first in-plane bias trace embedded in the dielectric layer;
a second in-plane bias trace embedded in the dielectric layer;
an in-plane signal trace embedded in the dielectric layer and horizontally positioned along a first surface of the dielectric layer between the first and second in-plane bias traces, wherein the first and second in-plane bias traces extend an in-plane bias trace depth into the first dielectric layer and the in-plane signal trace extends an in-plane signal trace depth into the first dielectric layer, the in-plane bias trace depth being greater than the in-plane signal trace depth;
a first out-of-plane bias trace positioned on the first surface of the dielectric layer;
a second out-of-plane bias trace positioned on the first surface of the dielectric layer; and
an out-of-plane signal trace horizontally positioned on the first surface of the dielectric layer between the first and second out-of-plane bias traces, wherein the first and second out-of-plane bias traces extend an out-of-plane bias trace height above the first surface of the dielectric layer and the out-of-plane signal trace extends an out-of-plane signal trace height above the first surface of the dielectric layer, the out-of-plane bias trace height being greater than the out-of-plane signal trace height.

16. The embedded trace substrate of claim 15, wherein;
the in-plane bias trace depth is different from the in-plane signal trace depth.

17. The embedded trace substrate of claim 15, wherein;
the out-of-plane bias trace height is different from the out-of-plane signal trace height.

18. The embedded trace substrate of claim 15, wherein;
the in-plane bias trace depth and the in-plane signal trace depth are chosen to provide desired electrical properties.

19. The embedded trace substrate of claim 15, wherein;
the first and second in-plane bias traces are shaped to optimize electrical performance.

* * * * *

UNITED STATES PATENT AND TRADEMARK OFFICE
CERTIFICATE OF CORRECTION

PATENT NO. : 7,589,398 B1
APPLICATION NO. : 11/543540
DATED : September 15, 2009
INVENTOR(S) : Ronald Patrick Huemoeller et al.

Page 1 of 1

It is certified that error appears in the above-identified patent and that said Letters Patent is hereby corrected as shown below:

On the Title Page, item 75, Line 2, replace "Phoexix" with --Phoenix--.

Signed and Sealed this

Twenty-ninth Day of December, 2009

David J. Kappos
*Director of the United States Patent and Trademark Office*